(12) United States Patent
Hart et al.

(10) Patent No.: US 10,138,120 B2
(45) Date of Patent: Nov. 27, 2018

(54) SHAPING NANOSTRUCTURE ARRAYS

(75) Inventors: Anastasios John Hart, Ann Arbor, MI (US); Sameh Tawfick, Ann Arbor, MI (US); Michael DeVolder, Heverlee (BE); Davor Copic, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 1435 days.

(21) Appl. No.: 13/260,945

(22) PCT Filed: Mar. 31, 2010

(86) PCT No.: PCT/US2010/029530
§ 371 (c)(1),
(2), (4) Date: Dec. 19, 2011

(87) PCT Pub. No.: WO2010/120564
PCT Pub. Date: Oct. 21, 2010

(65) Prior Publication Data
US 2012/0126449 A1    May 24, 2012

Related U.S. Application Data

(60) Provisional application No. 61/165,431, filed on Mar. 31, 2009.

(51) Int. Cl.
*B82B 3/00*       (2006.01)
*B29C 70/14*     (2006.01)
(Continued)

(52) U.S. Cl.
CPC ............... *B82B 3/00* (2013.01); *B29C 70/14* (2013.01); *B81C 1/00031* (2013.01); *B82Y 30/00* (2013.01); *B82Y 40/00* (2013.01)

(58) Field of Classification Search
CPC ......................................................... B82B 3/00
(Continued)

(56) References Cited

U.S. PATENT DOCUMENTS 7,491,628 B2    2/2009  Noca et al.
2006/0073089 A1*  4/2006  Ajayan et al. ............ 423/447.2
(Continued)

OTHER PUBLICATIONS

Hurd ("Process for aggregation of micron-sized patterns of vertically aligned carbon nanotube forests" BYU, Aug. 2008).*
(Continued)

*Primary Examiner* — Larry W Thrower
(74) *Attorney, Agent, or Firm* — Reising Ethington P.C.

(57) ABSTRACT

Nanostructured assemblies are manufactured by condensing an evaporated wetting agent onto a nanostructure array formed from a plurality of generally aligned carbon nanotubes or other nanostructures. The condensed wetting agent draws the individual nanostructures together to form various geometries of nanostructured assemblies based on various parameters including process variables and the starting shape and dimensional features of the nanostructure array. Various simple and complex geometries can be achieved in this manner, including geometries that are curved, bent, or twisted. Adjacent nanostructure arrays of the same or different starting geometries can be shaped into compound or interrelating structures. Additional process steps such as plasma etching, coating and others can be used to control the shaping and structural attributes of the nanostructured assemblies. A method of making a molded replica of a shaped nanostructure array is also disclosed.

9 Claims, 24 Drawing Sheets

(51) Int. Cl.
*B81C 1/00* (2006.01)
*B82Y 30/00* (2011.01)
*B82Y 40/00* (2011.01)

(58) Field of Classification Search
USPC .......................................................... 264/220
See application file for complete search history.

(56) References Cited

U.S. PATENT DOCUMENTS

2008/0292835 A1    11/2008  Pan et al.
2008/0302676 A1*   12/2008  Soundarrajan ......... B82Y 10/00
                                                    205/785.5

OTHER PUBLICATIONS

Rossi et al. ("Deformation of Carbon Nanotubes by Exposure to Water Vapor.") Langmuir 2009, 25, 2804-2810.*
International Search Report for PCT/2010/029530, dated Oct. 29, 2010, 4 pages.
Liu, HuAN, et al., Soft Matter, 2006, vol. 2, pp. 811-821, abstract, Fig 1 and 4.

* cited by examiner

PRIOR ART
"Grow-Molded" CNT Microstructures 100 m 1 mm (a) Growth catalyst pattern (b)

100 m 2 m 20 m

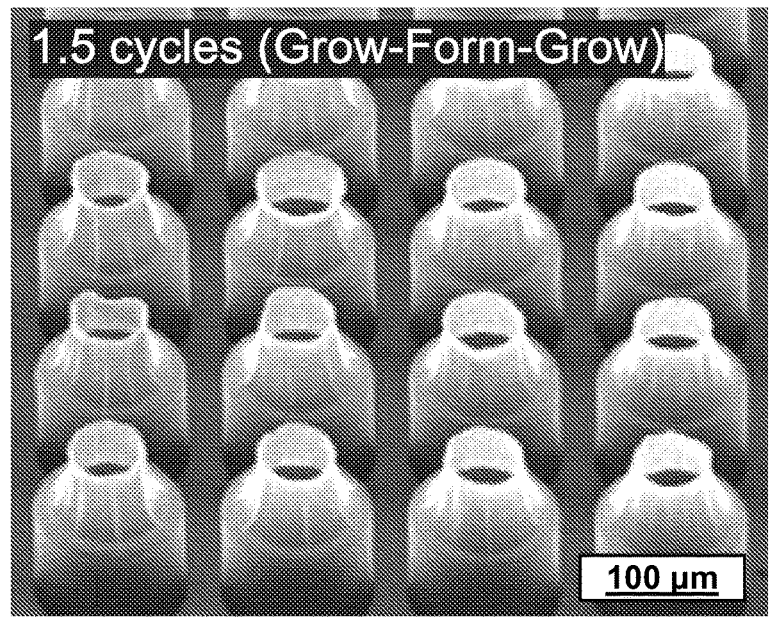
Figure 19(a)
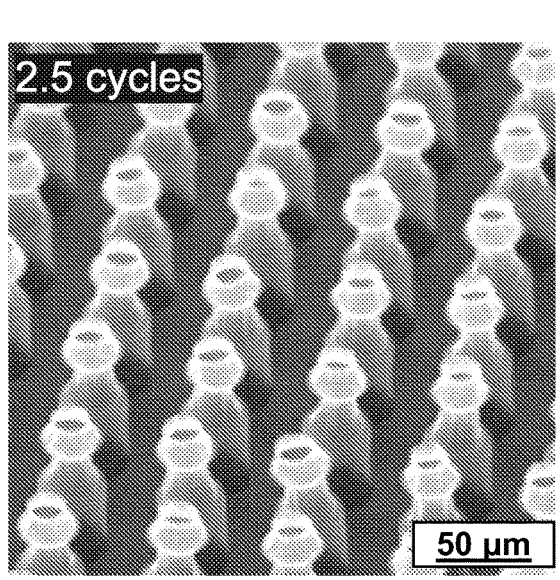 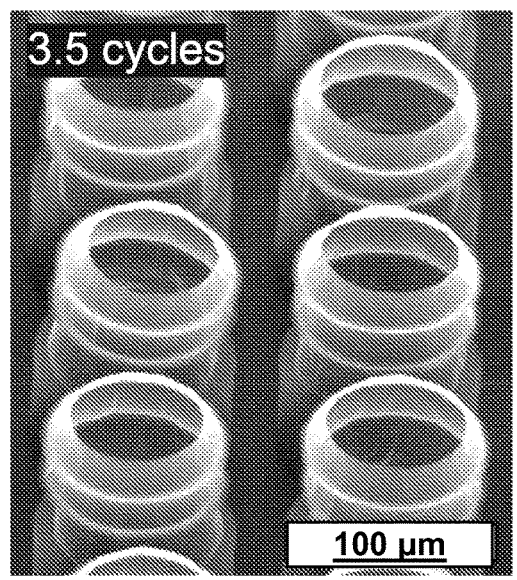
Figure 19(b)　　　　　　Figure 19(c)

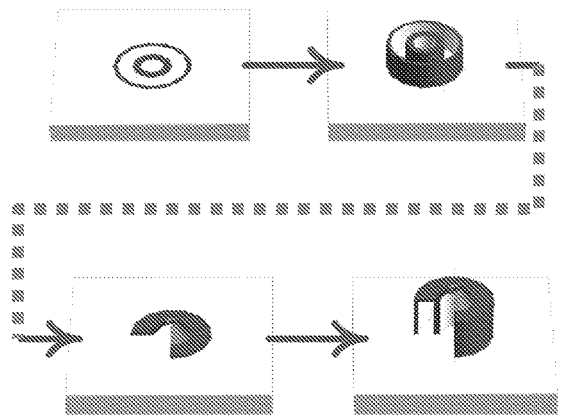
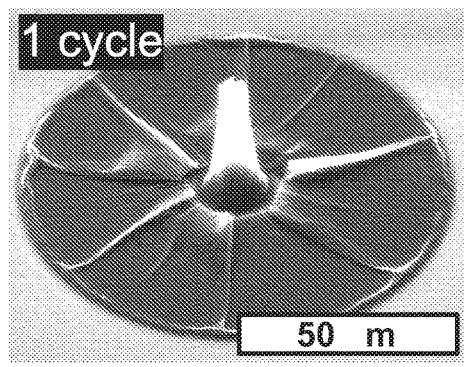
Figure 21(a)  Figure 21(b)
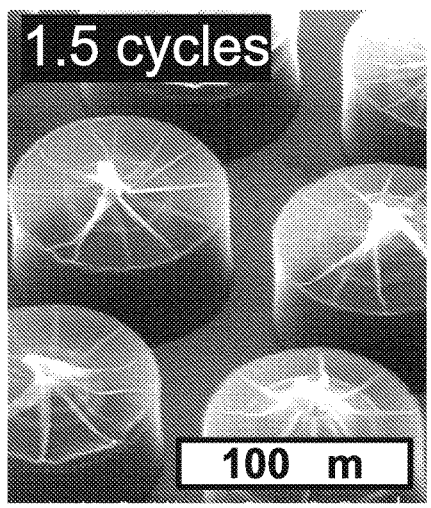
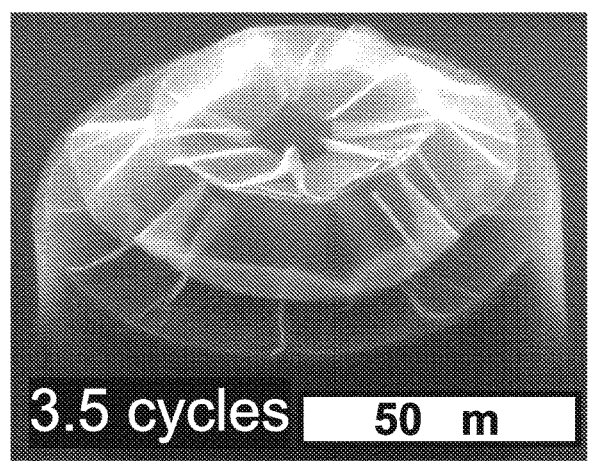
Figure 22(a)  Figure 22(b)

SHAPING NANOSTRUCTURE ARRAYS

TECHNICAL FIELD

This invention relates generally to nanostructures and microstructures and, in particular, to the processing of nanostructures to improve their utility in electrical, mechanical, thermal, fluidic, and other applications.

BACKGROUND OF THE INVENTION

The next generation of nano- and microsystems will likely require increasingly small and complex structures made of versatile materials. Growth of the commercial MEMS industry has fostered many manufacturing innovations towards extreme miniaturization, including immersion, deep UV, and nanoimprint lithography, and including versatile patterning techniques such as SU-8 processing, deep reactive ion etching of silicon, and soft lithography using PDMS. However, it remains challenging to create freeform (3D) shapes at the nano- and micro-scales. For example, very few processes allow generation of non-planar, curved, or re-entrant geometries. This impedes the development of such things as photonic crystals, biomimetic microsystems, scaffolds for tissue engineering, high luminosity lighting panels, and surfaces having controllable wetting, adhesion, and haptic properties.

Many existing methods of 3D micro- and nanofabrication are based on processing of photosensitive polymers such as SU-8 using, for example, multiple layer, spatially modulated, or inclined exposure techniques. These methods can require multiple sequential alignments and/or may be limited to a maximum inclination angle of about 39°.

Existing methods include serial processes that can create arbitrary 3D forms, including stereolithography, multiphoton lithography, and focused ion beam (FIB) machining. These methods do not particularly lend themselves to batch manufacturing processes, due to, for instance, a tradeoff between resolution and throughput, and may be practically limited to fabricating master templates, forming individual microstructures, or making small batches.

Holographic lithography is another method that can be used to create arrays of 3D microstructures in parallel. But microstructure geometry is determined by the interference of laser beams, limiting the available geometries to periodic patterns.

Further, most of these known fabrication techniques are useful with a limited number of select polymers and are not useful with more structural materials such as ceramics and metals. This can limit the utility of the structures generated by these techniques. For example, SU-8 has a glass transition temperature of only 200° C. and a Young's modulus (E) of about 5 GPa, thereby limiting the environment and conditions in which it can be useful.

Growth of vertically-aligned forests or arrays of nanostructures such as carbon nanotubes (CNTs) or silicon nanowires (SiNWs) is a viable means of self-assembling nanostructures into larger-scale structures with dimensions ranging from the sub-micrometer to millimeter scale. However, despite the exceptional functional properties of individual nanostructures such as CNTs, the bulk properties of such forests are typically poor due to the low density of nanostructure growth, typically about 1-5% of that of an ideal tightly packed configuration. This can be a significant limitation for practical applications, because the spacing among the CNTs can dominate the bulk properties of the forest. For example, the elastic modulus of a CNT forest with 1% packing density is in the range of only tens of MPa, while the expected elastic modulus for individual CNTs is in the range of hundreds of GPa. This can render nanostructure forests inadequate for many nano- and micro-device applications. It can also limit compatibility with post-processing techniques that can require greater structural stability than is available with low density nanostructure arrays. While improvements in the as-grown density of CNT forests are possible, it is practically limited by the required spacing between the catalyst particles on the substrate. It is even more difficult to increase the density of smaller diameter CNTs because smaller catalyst nanoparticles are more mobile on the substrate. Increasing the packing density in CNT arrays can improve their bulk properties, thereby making CNTs more useful in practical applications.

One method of creating 3D microstructures from nanostructures includes confining nanostructure growth within etched silicon cavities such as inverted microchannels clamped to the growth substrate. In this manner, nanostructures can be "grow-molded" into convex 3D shapes, such as those illustrated in FIG. 1. However, the compressive forces exerted by the cavity can destroy nanostructure alignment and introduce structural defects during formation. Such a grow-mold process limits the geometry of the final structure and does not accommodate thin walls or re-entrant curve shapes.

One method of bulk densification of nanostructure arrays using capillary forces includes immersing the arrays in a liquid. This method generally includes immersing or dipping nanostructure arrays attached to their growth substrate into a liquid and withdrawing them from the liquid. This method has been shown to enable only bulk contraction or unidirectional manipulation of the arrays and has other limitations, often resulting in the liquid menisci bridging multiple adjacent nanostructure arrays on the substrate during immersion and/or withdrawal from the liquid. FIG. 2(a) shows a set of patterned nanostructure arrays on a growth substrate, with FIG. 2(b) depicting a possible result of using a liquid immersion method to densify the nanostructure arrays of FIG. 2(a). While the resulting nanostructure arrays may be densified, the capillary forces induced by the bulk liquid can result in the arrays collapsing to positions adjacent to the substrate, generally being toppled in the direction of gravity as the substrate is withdrawn from the liquid. An arrow indicating the direction of immersion and withdrawal from the liquid is shown in FIG. 2(b), and toppling of the arrays, generally in the opposite direction, is illustrated.

These methods of shaping using molds to confine growth and liquid immersion to densify nanostructure arrays are inherently limited in their ability to generate the variety of shapes and bulk properties for which the arrays are potentially useful. Synthetic replication of many natural processes requires more complex shaping ability. For example, nature uses self-assembly to create hierarchical freeform geometries such as tissues and skeletal structures, that have inherent anisotropy that creates directional and responsive properties. However, synthetic self-assembly typically lacks deterministic control of shape at a length scale far exceeding that of the constituent building block. Nevertheless, self-assembly offers promise to complement top-down fabrication by creating hierarchical structures made of diverse components including block copolymers, DNA strands, nanocrystals, nanowires, and nanotubes. In particular, surface tension is useful for manipulating small structures, and has been utilized to fold thin film, to interlock microcomponents, and to create tightly packed arrangements of nanoparticles and microspheres or to aggregate wet hair, microfibers, and polymer pillars.

BRIEF DESCRIPTION OF THE DRAWINGS

FIG. 19(a) illustrates an example of hollow cylinder carbon nanotube arrays after 1.5 cycles of sequential growing and shaping;

FIG. 19(b) illustrates an example of hollow cylinder carbon nanotube arrays after 2.5 cycles of sequential growing and shaping;

FIG. 19(c) illustrates an example of hollow cylinder carbon nanotube arrays after 3.5 cycles of sequential growing and shaping;

FIG. 21(a) depicts an embodiment of forming closed micro-containers;

FIG. 21(b) is an image of an exemplary closed micro-container;

FIG. 22(a) is an image of an exemplary array of micro-containers that are formed after 1.5 cycles of growing and shaping;

FIG. 22(b) is an image of an exemplary micro-container that is formed after 3.5 cycles of growing and shaping;

DETAILED DESCRIPTION OF THE PREFERRED EMBODIMENTS

Figure 1:
FIG. 1 is an image depicting carbon nanotubes that are grown using a known grow-mold process.

Nanostructures of the type contemplated herein are structures having at least two dimensions in the nanoscale; for example, elongate structures having a diameter or plural cross-sectional dimensions within the general range of 0.1 to 100 or more nanometers. This includes, for example, nanotubes, nanowires, nanorods, nanocolumns, and nanofibers. A nanostructure array can comprise a plurality of nanostructures having their elongate dimensions generally aligned with one another or in the same general direction. For example, a vertically-aligned nanostructure array comprises a plurality of nanostructures generally aligned in a direction extending away from or generally perpendicular to a growth substrate. The height, length, and width of the nanostructure array can be in the nanoscale range, or can be larger; for example, in the micron or millimeter range. A nanostructure array can also comprise a plurality of randomly oriented, unaligned, or entangled nanostructures. Among the many types of nanotubes and nanowires, the choice of materials for a nanostructure array is subject to a number of considerations and constraints, including suitability of the materials for the desired application and compatibility of the nanostructures and related processing conditions (e.g., temperature, catalyst, precursors) with the fabrication process for the surrounding device. A nanostructure array can comprise nanostructures formed from one material, or can comprise nanostructures formed from two or more materials to create hybrid arrays. Individual nanostructures can be fabricated from various materials, including semi-conducting, metal, oxide, or other materials. Similarly, a nanostructure array can include various different nanostructures such as single-wall nanotubes, multi-wall nanotubes, or any of the other nanostructures listed above, all in the same array.

Microstructures can be broadly described as structures that are characterized by dimensions generally larger than the nanoscale and having dimensions on the millimeter scale or smaller, generally having dimensions less than tens of millimeters. More usually they are characterized by dimensions on the micron scale from 0.1 µm to 100 µm, or generally on a scale an order of magnitude larger than that of individual nanostructures. The microstructures described in the context of the methods disclosed herein can for example be described generally as a nanostructured assembly comprising a plurality or collection of nanostructures, such as the type arranged as a nanostructure array or forest that may be shaped, densified, or otherwise processed to enhance the overall utility of the nanostructures. Some microstructures, particularly complex microstructures, can be described as comprising one or more smaller microstructures and/or a plurality of nanostructures. Like nanostructure arrays, microstructures can include various types and geometries of nanostructures comprising the various materials previously discussed. Microstructures can also be formed from more than one processed nanostructure array such that the multiple nanostructure arrays are shaped in a manner that together forms the microstructure.

Figure 3:
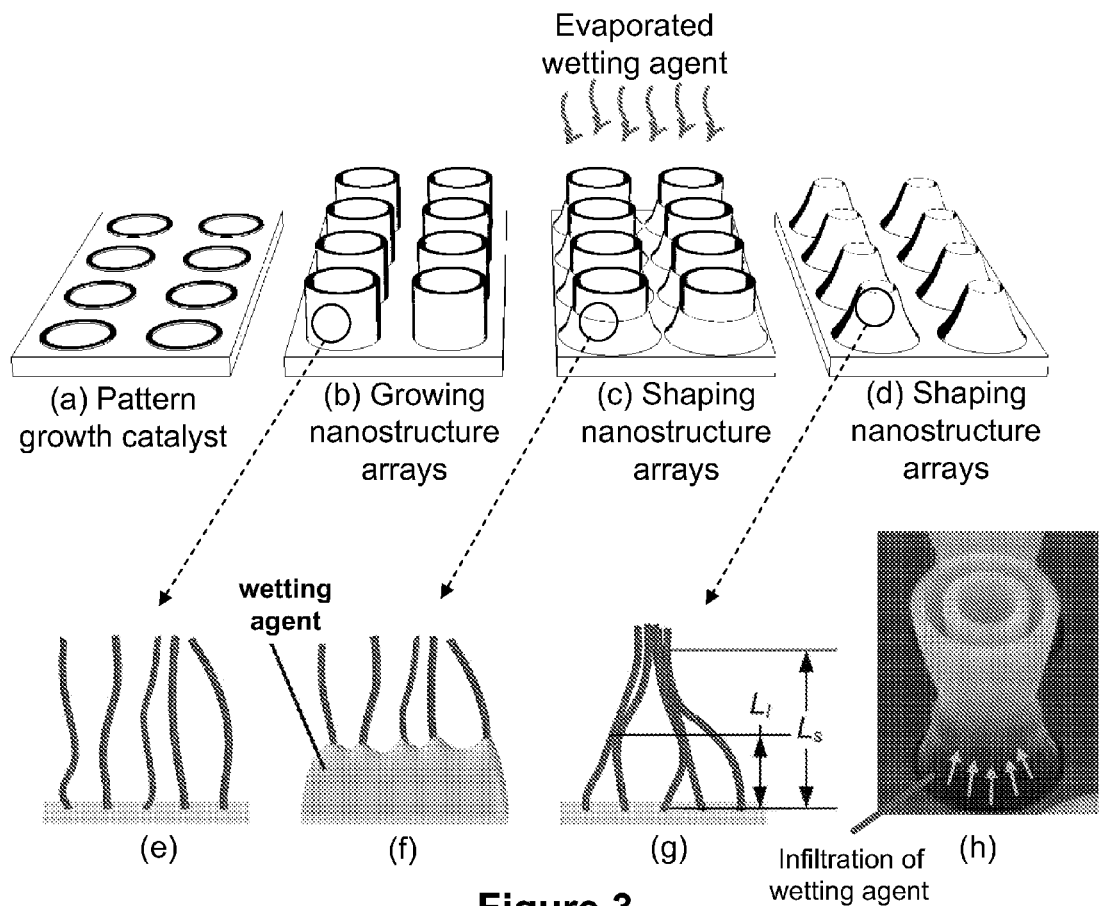
FIG. 3 includes FIGS. 3(a)-(h) which depict an embodiment of making a nanostructure assembly.

Methods of making a nanostructured assembly will be described herein. The nanostructured assembly can be formed from a single nanostructure array or multiple nanostructure arrays. In some embodiments, the nanostructured assembly comprises one or more microstructures, and in other embodiments the nanostructured assembly can be smaller or larger than this. In at least some embodiments, the method of making a nanostructured assembly can be described as generally including the steps of providing a nanostructure array comprising a plurality of nanostructures and shaping the nanostructure array using a wetting agent. Referring to FIG. 3, the providing step can include patterning a growth catalyst on a substrate and growing a nanostructure array. The patterning of the growth catalyst can be in a predetermined pattern on the substrate to achieve the desired pattern of nanostructures in the array. The array can be grown or otherwise provided as a plurality of generally aligned nanostructures that extend away from the substrate. The shaping of the nanostructure array can be accomplished using a wetting agent, preferably an evaporated wetting agent, as will be further described herein. The example depicted in the illustration of FIG. 3 indicates a plurality of growth catalyst patterns arranged on the substrate, with each pattern generally in the shape of a ring. Of course the shape of the catalyst pattern and the resulting array is virtually limitless, as is the number, arrangement, and geometries of the patterns on the substrate. The pattern will vary depending on the desired final geometry of the nanostructured assembly, many examples of which will be described in detail herein. From the catalyst patterns, nanostructure arrays can be grown as indicated in FIG. 3(b) using known techniques. The diagram of FIG. 3(e) depicts individual nanostructures extending away from the substrate before shaping of the array. Additionally, multiple catalyst and nanostructure array patterns can be arranged in a larger predetermined pattern of their own on the substrate. Each individual catalyst or array pattern can have its own geometry that can be the same or different as any other of the individual catalyst or array patterns on the substrate. This permits shaping of the arrays into different orientations relative to each other so that, for example, one shaped nanostructure array can be oriented at a compound angle relative to one or more of the other adjacent shaped arrays.

The shaping step may include providing an evaporated wetting agent and condensing the evaporated wetting agent on the substrate, on nanostructures that are attached to the substrate, or on both of the substrate and the nanostructures, as generally indicated in FIG. 3(c). Condensation of the wetting agent can be accomplished in various ways, such as by keeping the substrate and/or nanostructures at a temperature below the condensation point of the wetting agent, by controlling the pressure of the environment where the shaping occurs, or by a combination of both temperature and pressure control. When condensed to liquid form, the wetting agent can move through the nanostructure array via capillary action, generally in a space between individual nanostructures. FIG. 3(f) depicts wetting agent that has moved partially through the array between individual microstructures. This capillary or wicking action can also have the effect of drawing individual nanostructures closer to one another, thereby densifying the nanostructure array as the wetting agent moves through it. FIGS. 3(c) and 3(h) depict nanostructure arrays that have been partially densified, and FIG. 3(d) depicts the same nanostructure arrays that have been further densified.

The nanostructures and substrate can be exposed to the evaporated wetting agent from above, as shown in FIG. 3(c), from below (not shown), or from any other direction. For example, the shaping step can include providing an evaporated wetting agent source for producing the evaporated wetting agent underneath the nanostructure array. It can further include supporting or orienting the substrate above the evaporated wetting agent source such that the nanostructures extend downward from a surface of their supporting substrate towards the evaporated wetting agent source. In this manner, the wetting agent in liquid form can, for example, be heated from below to provide or produce the evaporated wetting agent. When the evaporated wetting agent contacts the cooler substrate and/or the nanostructure array, it can condense and shape the nanostructure array.

The shaping step can also include removing the condensed wetting agent from the nanostructure array, usually after the wetting agent is allowed to infiltrate the nanostructure array and to at least partially densify the array. Removing the wetting agent can be accomplished by evaporation of the condensed wetting agent or by other methods. FIG. 3(g) depicts some of the nanostructures of the nanostructure array after removal of the wetting agent, and also indicates modeling dimensions $L_I$ and $L_S$, which will be discussed further herein. Evaporation of the wetting agent can be accomplished in various ways, such as by increasing the temperature of the nanostructure arrays, by reducing the pressure of the environment where the nanostructure arrays reside, or by a combination of both. Relatively volatile wetting agents may readily evaporate at typical room conditions. Densification and shaping can occur during the condensation of the wetting agent, during movement of the condensed wetting agent through the nanostructure array, and/or during the evaporation of the condensed wetting agent. Additionally, during the shaping step, the condensing step and the evaporating step may occur simultaneously. For example, the evaporated wetting agent may condense primarily on the substrate and begin to infiltrate the nanostructure array near the substrate, gradually moving through the array in a direction away from the substrate, see FIG. 3(h). When using a volatile wetting agent with a relatively high vapor pressure, the condensed wetting agent may begin to evaporate as it moves through the array while additional evaporated wetting agent is being condensed on the substrate. One way of exercising greater control over the shaping step, particularly including the condensation and evaporation of the wetting agent, is to carry out the shaping step in a chamber in which the temperature and pressure within the chamber can be controlled.

Figure 4:
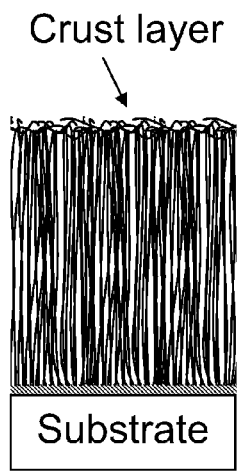
FIG. 4 depicts an exemplary crust layer that is formed on a nanostructure array.

A first or proximal end of each nanostructure array is generally constrained by attachment at the substrate, while a second or distal end of each nanostructure array is generally unconstrained. This can cause the degree or magnitude of densification of the array to vary between the proximal end and the distal end and usually results in a non-uniform cross-section for the resulting microstructure after the shaping step. For example, after shaping, near the proximal end, an average distance between adjacent nanostructures may be greater than an average distance between adjacent nanostructures near the distal end. One way to further control the amount of constraint within an array is to remove a portion of the array prior to the shaping step. For example, at the distal end of some types of nanostructure arrays, such as CNT arrays, a layer of randomly oriented nanostructures which are generally entangled with one another. This "crust" layer, as shown in FIG. 4, is usually formed by entanglement of individual nanostructures of the nanostructure array at the beginning of a growth cycle before the nanostructures begin to self-align. Removal of such a portion of the array by etching or other suitable methods can affect the level of densification of the nanostructure array, particularly at the distal end, and thereby affect the final shape of the microstructure. Plasma etching is one suitable method to remove portions of nanostructure arrays such as the portion at the distal end that may include entangled nano structures. Generally, removal of this crust layer can allow a higher degree of densification at the distal end of the nanostructure array than if the layer is not removed, and can also affect the final shape as discussed below.

Figure 5:
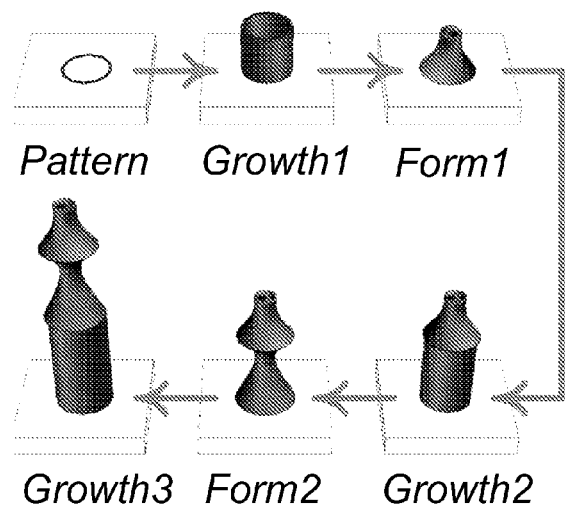
FIG. 5 depicts an embodiment of making a microstructure by iteratively repeating nanostructure array growth and shaping steps.

Referring to FIG. 5, a method of making a microstructure can be described that further includes at least one additional layer of nanostructures, for instance by an additional growth step of nanostructures. In the example depicted, a microstructure can be made according to the method already described, wherein the providing step includes providing a first growth of nanostructures. After shaping the first growth with the method described above, the method can further include providing a second growth of nanostructures (shown as Growth2) and thereafter shaping the second growth of nanostructures (shown as Form2). In the example shown, the second growth is located between the first growth and the growth substrate. These method steps can be repeated as desired for as many cycles as the growth catalyst can remain active in embodiments where sequential providing steps include growing nanostructures from the same catalyst nanoparticles. For example, FIG. 5 shows a third growth of nanostructures (shown as Growth3). This method is depicted starting with other predetermined patterns of growth catalyst in FIGS. 20(a) and 21(a), which will be discussed in further detail herein. The nanostructure layers can be generated by regrowing from the same catalyst as described above, or can be added or assembled by any other suitable method. In addition, the nanostructure properties or shaping process can be varied from layer to layer to further increase the functionality. Sequential growths of nanostructures or other microstructures can be provided by other methods. For example, nanostructures can be grown from catalyst patterns deposited on previously made microstructures that may have been made by these or other methods.

Microstructures formed by the methods herein disclosed are often characterized by the preservation of alignment, after shaping, of adjacent nanostructures of a nanostructure array and by the elimination of alignment of non-adjacent nanostructures in various portions of the shaped nanostructure array. For example, it can be readily understood that the microstructures depicted in FIG. 3(d) are formed by shaping the nanostructure arrays depicted in FIG. 3(b). In the nanostructure arrays of FIG. 3(b), all of the nanostructures that comprise each array are generally vertically aligned with one another whether or not they are adjacent to one another. For example, the nanostructures of FIG. 3(b) are arranged on the substrate to form a cylindrical nanostructure array wherein generally all of the nanostructures than comprise the array are in alignment, including nanostructures that may be on opposite sides of the cylinder. After the shaping step, the resulting microstructure is generally a bell shape. In this shape, adjacent nanostructures remain locally aligned with one another, while nanostructures on opposite sides of the microstructure, for example, extend away from the substrate in different directions. In this example, the nanostructures that comprise the microstructure extend generally toward a center of the microstructure.

Various wetting agents can be used with the methods herein disclosed. Generally, any liquid/gas that has an evaporation/condensation point in a practical temperature range for the materials comprising the nanostructures and the substrate can be used. It is preferable that the wetting agent effectively wets the microstructures and allows the shaping to occur. In embodiments that include CNT microstructures, some examples of suitable wetting agents include acetone, glycerol, and isopropanol. Water may also be a suitable wetting agent for use with some types of nanostructures. Various characteristics of the wetting agent will affect the shaping of nanostructure arrays into microstructures, such as the density, viscosity, vapor pressure, contact angle with a given nanostructure, and others. Thus, the selection of a wetting agent can affect the final microstructure geometry and the kinetics of the shaping process.

While the shaping methods described above have generally been described as applying to nanostructure arrays to form microstructures, it is also possible to use these methods on some types of microstructure arrays where the capillary forces are sufficient to deform individual microstructures. A microstructure array may include a plurality of closely spaced microstructures having elongate dimensions generally aligned with one another or in the same general direction. The height, length, and width of the microstructure array can be in the microscale range, or can be larger; for example, in the millimeter range. The individual microstructures of the microstructure array can be formed from nanostructure arrays using the methods disclosed herein, or they can be formed as microfibers, microwiskers, or other single-component structures. The individual microstructures can be formed using other known microfabrication techniques such as lithography, focused ion-beam machining, or other techniques. Where the microstructures have voids such as in foam, the methods disclosed herein can be used for densification or other shaping of the individual microstructures by inward collapsing of the microstructures to at least partially close the voids.

In the examples disclosed herein, methods of making microstructures are generally applied to nanostructure arrays comprising CNTs. The wetting agent generally used in the applicable shaping steps of these examples comprises acetone. These materials selections are of course only exemplary.

Growing and Characterizing Nanostructure Arrays

Figure 6A:
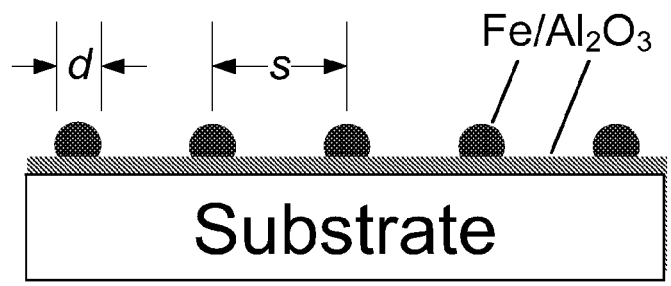
FIG. 6(a) is a diagram illustrating the diameter and spacing of catalyst particles on a substrate according to one embodiment.
Figure 6B:
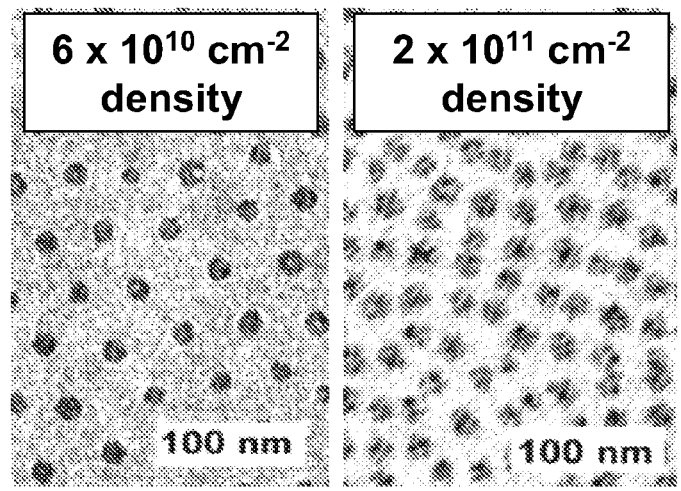
FIG. 6(b) depicts images of exemplary catalyst distributions of varying areal density on a growth substrate.

At least one type of nanostructure, CNTs, can be grown by thermal chemical vapor deposition (CVD) at atmospheric pressure. Catalyst nanoparticles arranged on the substrate act as templates for CNT nucleation. When the CNTs self-align, as shown in FIG. 4, due to crowding during the initial stages of growth, a vertically-aligned "forest" or array is created and stabilized by a balance of elastic energy and van der Waals interactions among the CNTs. This hierarchical forest structure can grow to a height of several millimeters while the CNTs remain attached to the catalyst particles on the substrate. FIG. 4 illustrates how the top surface of a CNT array can form a tangled crust layer, representing the initial stage of growth before the CNTs self-align in the growth direction. Typically, CNT forests are grown from iron (Fe) nanoparticles supported on $Al_2O_3$ in a mixture of $C_2H_4/H_2/He$ at 600-900° C. Typical reactant flow rates are about 100/400/100 sccm for the respective gases, and typical growth temperature is about 775° C. and can be carried out in a horizontal tube furnace or similar chamber. The catalyst can be deposited by electron beam evaporation of high-purity source materials. More specifically, the growth substrate is typically thermally-oxidized (100) silicon wafers on which 10 nm of $Al_2O_3$ and 1 nm Fe are sequentially deposited by e-beam evaporation and are patterned by liftoff of photoresist (SPR 220). Another method of catalyst deposition is spin-coating of a solution of Fe nanoparticles templated by poly(styrene-b-acrylic acid) block copolymer (BCP) micelles. Other catalyst deposition methods are possible. The diameter (d) and spacing (s) of catalyst particles on the substrate determine the CNT diameter and areal density, respectively (see FIG. 6(a)). With the physically deposited catalyst, the duration and temperature of treatment in a reducing atmosphere governs the agglomeration and coarsening of the film into the catalyst nanoparticles. By controlling this multivariable process, it is possible to grow CNT forests or arrays wherein the CNTs have from 1 to 25 concentric walls (2 to 30 nm diameter) with concomitant changes in areal density from $10^{10}$-$10^{12}$ $CNTs/cm^2$. FIG. 6(b) shows examples of catalyst distributions of varying areal density on a growth substrate. A typical vertical growth rate is about 100 μm/minute, and a typical growth time is from about 0.5 to 5 minutes. Catalyst growth patterns for CNT arrays can have minimum critical dimensions of 1 μm or less and maximum dimensions of about 0.1 mm. Precise control of the CNT growth time by rapid introduction and evacuation of the reactant mixture can allow control of the height of the CNT arrays from below 5 μm to about 1 mm.

Figure 7:
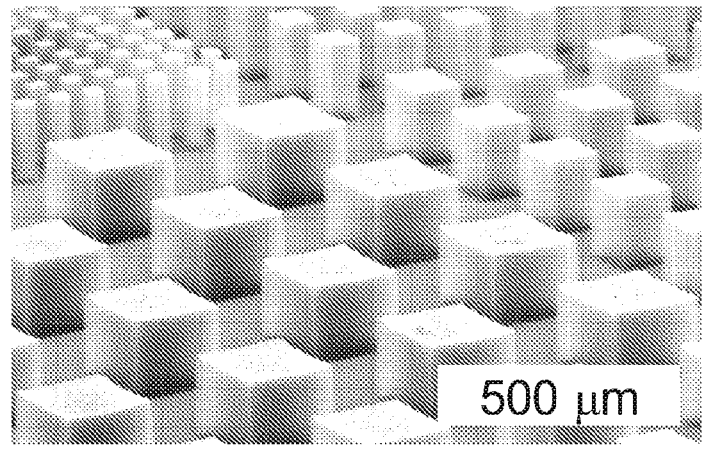
FIG. 7 is an image depicting an exemplary carbon nanotube array having straight sidewalls and arbitrary cross-sectional shape.

Patterning the catalyst film, for example by lift-off of the catalyst film or by contact printing of the BCP solution, can enable growth of CNT forests or other nanostructure arrays having straight sidewalls and arbitrary cross-sectional shape, such as those shown in FIG. 7. With appropriate process control, the cross-section of these CNT arrays can be as small as several microns across, and aspect ratios can exceed 25:1 before tilting occurs due to asymmetry in growth rate across the catalyst pattern.

Shaping Nanostructure Arrays to Form Microstructures

Freeform microstructures can be made by densifying and shaping nanostructure arrays using capillary forces. In the case of CNT arrays and the growth process described above, other growth process steps can affect the shaping of the arrays. For example, the substrate can be rapidly cooled in the growth atmosphere before purging the CVD chamber (at below 100° C.) to improve CNT-substrate adhesion and to thereby prevent the CNTs from detaching from the substrate during the shaping process. Additionally, the crust layer of the CNT array can be optionally removed by methods such as $O_2$ plasma etching to affect the subsequent densification and shaping of the array, particularly at its distal end. Etching can be performed using a Plasmatherm 790 with 10 sccm $O_2$ at a pressure of 75 mTorr and power of 80 W, for a time ranging from 20 to 40 seconds. Further significance of the crust layer will be discussed further herein. In addition, selectively coating the nanostructures prior to shaping or confining the densification to a limited portion of the array can further affect the shaping process.

Figure 23:
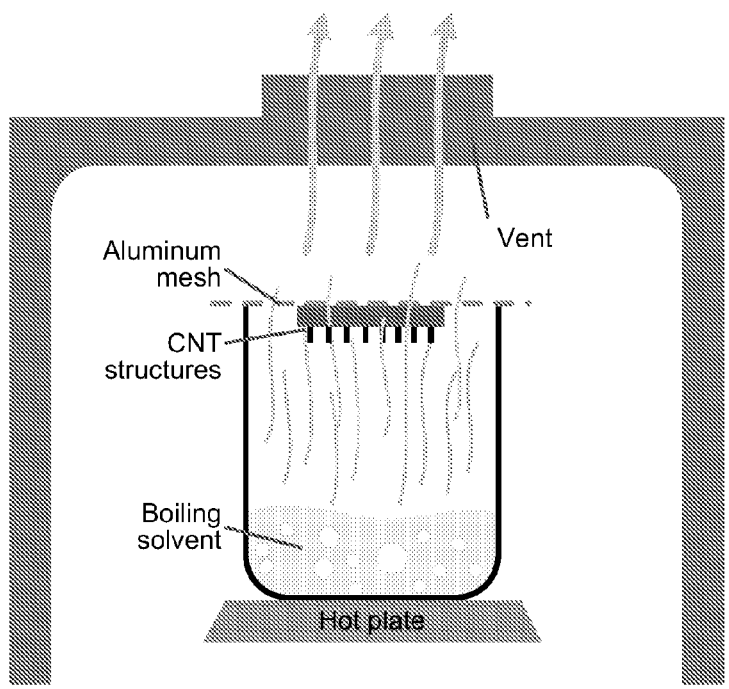
FIG. 23 is a diagram of an open-topped, heated vessel containing a liquid wetting agent.

As shown in FIG. 23, the substrate and nanostructure array or arrays can be inverted over an open-topped, heated vessel containing a liquid wetting agent. The wetting agent is heated to its boiling point. For example, a 1 liter beaker with a small volume of liquid such as acetone (e.g., about 20 mL) creates a uniform upward vapor flux when heated, and keeps the substrate at a lower temperature that drives condensation of the liquid on the substrate and/or nanostructure arrays. The substrate is held in the vapor stream for a duration ranging from seconds to minutes, depending on the size of the CNT microstructures. This duration can be determined experimentally by growing CNT microstructures to different lengths and observing the extent of capillary forming ex situ using SEM imaging. In experiments conducted, approximately 1 second of vapor exposure was used for every 50 micrometers of CNT length. Alternatively, the substrate can be left in place until the beaker is empty and until the condensed liquid has evaporated from the substrate. This typically takes about 5-10 minutes for 20 mL acetone example given above. However, experiments suggest that infiltration and densification can occur in less than 10 seconds in the case of CNT arrays shaped with an acetone wetting agent. Examination of partially densified arrays by optical and electron microscopy suggests that infiltration occurs primarily from the base of the CNT arrays, as only the portion of the arrays nearest the substrate is densified when the process is interrupted after a very short time. This is shown in the SEM images of FIG. 3(h), wherein a partially shaped nanostructure array is shown, demonstrating that the evaporated wetting agent infiltrates the nanostructures from the base up. Of course the array can be exposed to evaporated wetting agent in a variety of ways, such as supporting the substrate and CNT arrays in an enclosed chamber through which evaporated wetting agent is circulated, or by other means. In a enclosed chamber environment, other process variables may be controllable, such as the liquid vapor pressure, the vapor flow rate (evaporation rate), flow pattern, the substrate temperature, the chamber pressure, the liquid temperature, and chamber wall temperature (to prevent condensation on chamber walls).

Figure 2:
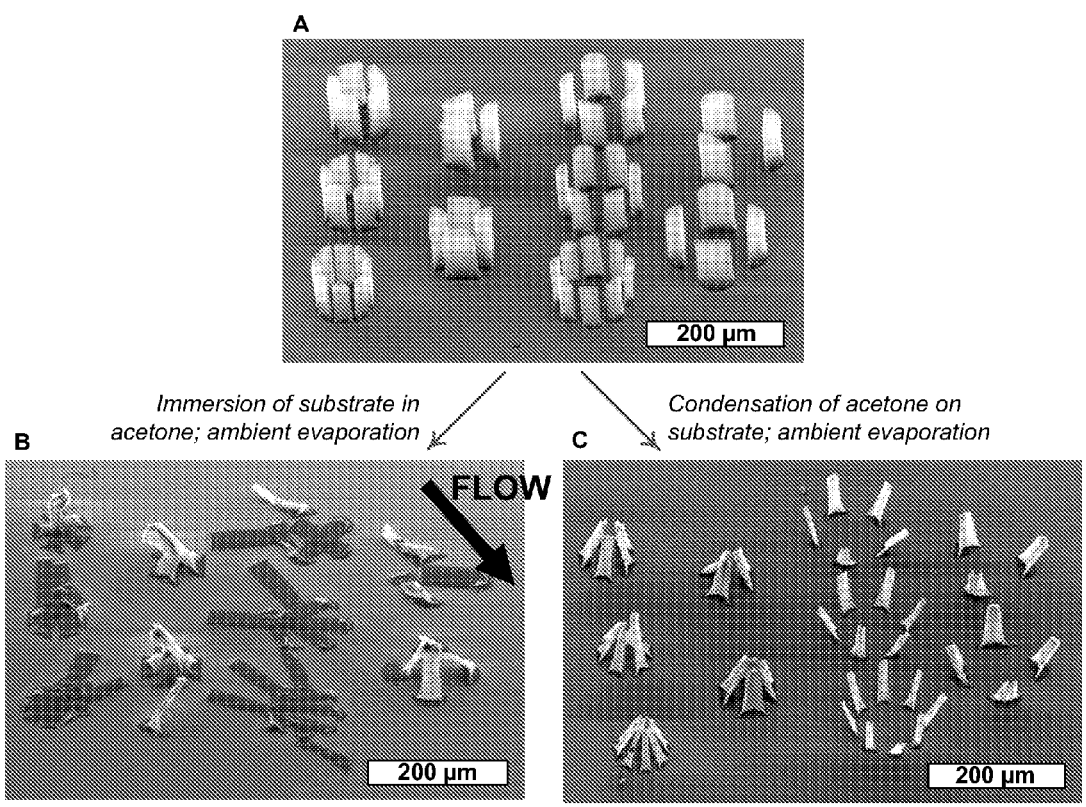
FIG. 2 includes FIGS. 2(a) to 2(c) which depict exemplary resulting nanostructure arrays that are formed using a known liquid immersion method.

Using evaporated wetting agent to infiltrate each array independently allows very delicate and closely-spaced microstructures to be formed on the same growth substrate, simultaneously. The arrays could be damaged if a liquid meniscus bridges adjacent arrays on the substrate by using densification methods such as immersion, as already indicated in FIG. 2(b), where the arrays are deformed in bulk with little or no control over the final shape after densification. In contrast, as shown in FIG. 2(c), the starting nanostructure arrays of FIG. 2(a) can be shaped in a more delicate manner using evaporated wetting agent, allowing the capillary forces within each individual array to reach equilibrium with the elastic properties of the nanostructures without being overwhelmed by the bulk pressure of the liquid acting externally on the arrays.

Figure 8A:
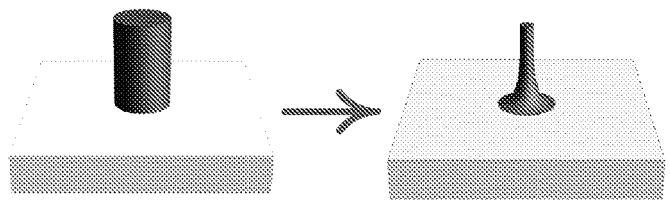
FIG. 8(a) illustrates an embodiment of forming a tapered vertical structure.
Figure 8C:
FIG. 8(c) depicts an image of a tapered vertical structure.
Figure 8B:
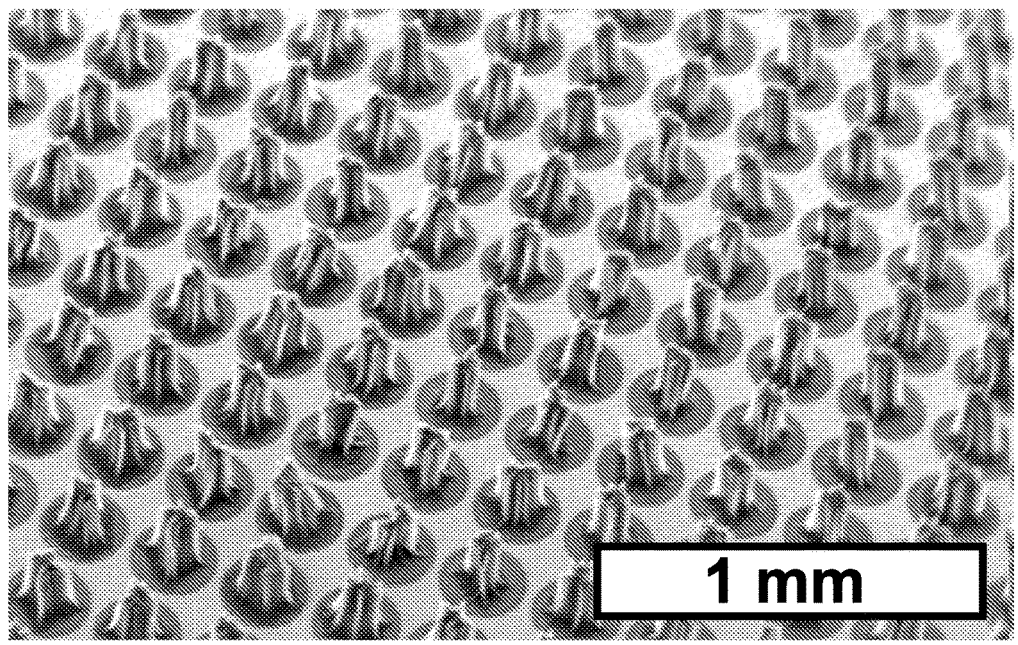
FIG. 8(b) depicts an image of a nanostructure array having a plurality of tapered vertical structures.

By changing the size and the shape of the nanostructure array, for example by changing the shape of the growth catalyst pattern and the growth time or height of the array, the geometry of the microstructure after capillary forming or shaping can be controlled. Some examples are shown in FIGS. 8-16. Symmetric solid patterns, such as the solid circular pattern shown in FIG. 8(a) or a solid square pattern, can form tapered vertical structures or "pins" as indicated in FIGS. 8(a)-(c).

Figure 9A:
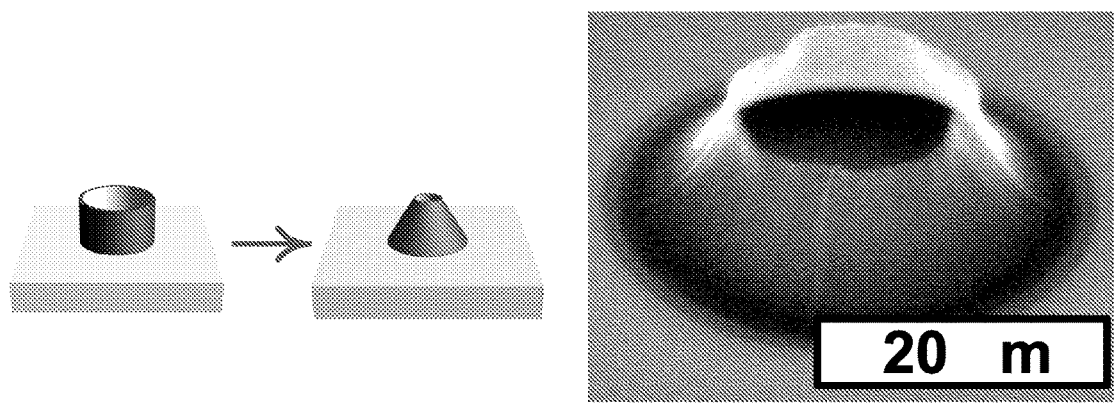
FIG. 9(a) depicts an exemplary microstructure having a micro-well or conical shape.
Figure 9B:
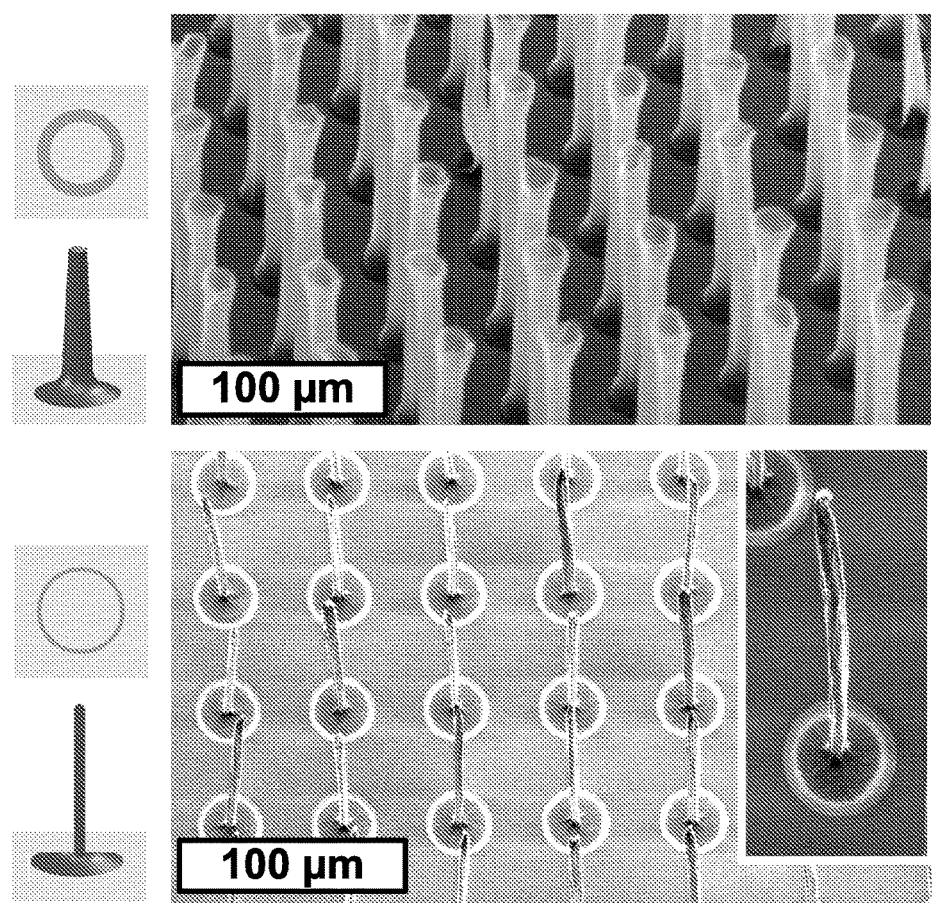
FIG. 9(b) depicts an exemplary microstructure array having a plurality of tubular structures.
Figure 9C:
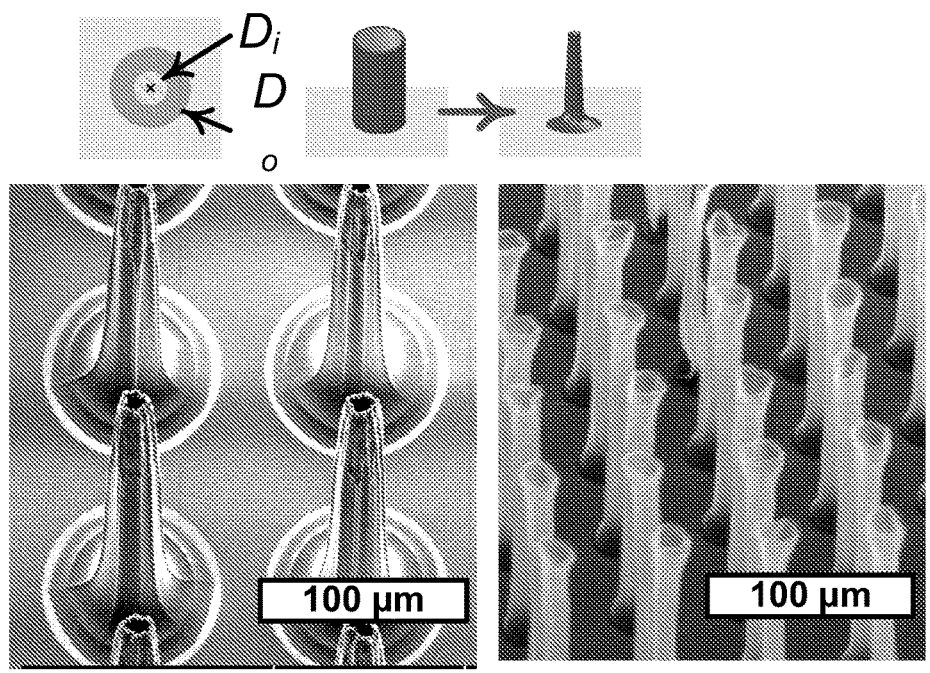
FIG. 9(c) depicts another exemplary microstructure array having a plurality of tubular structures.
Figure 9D:
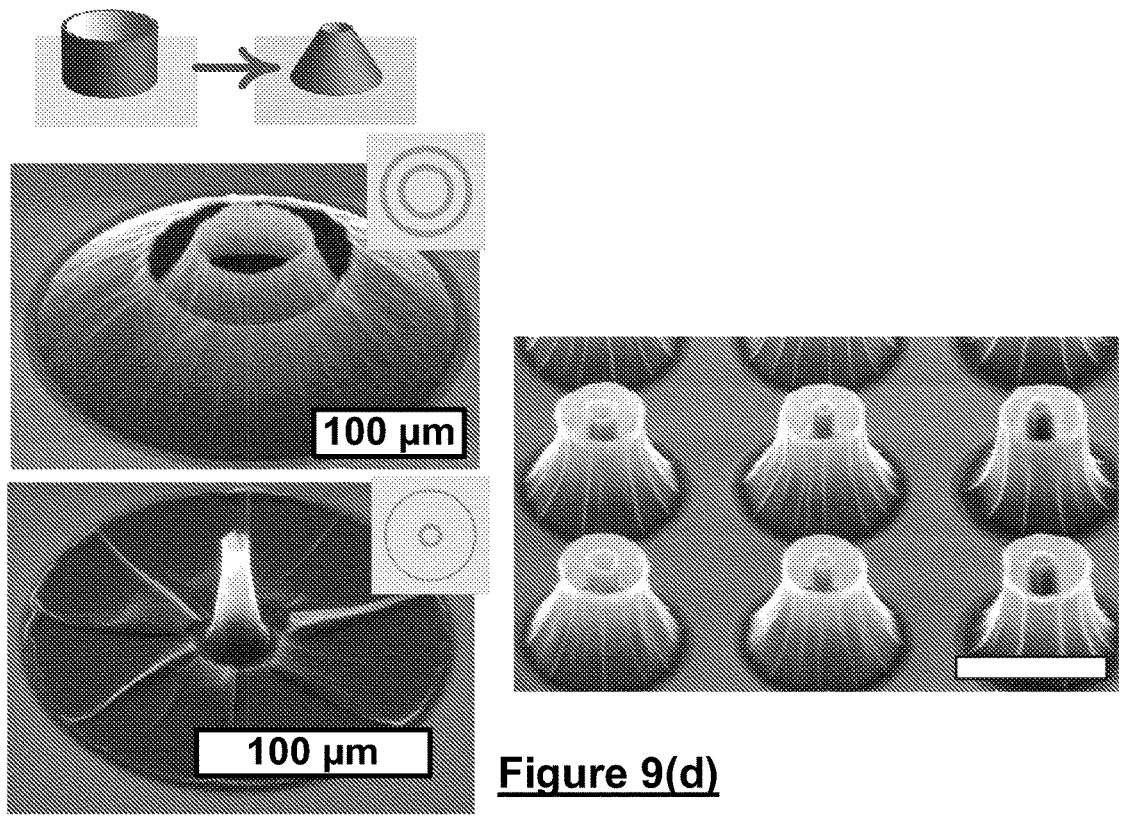
FIG. 9(d) depicts yet another exemplary microstructure array having a plurality of tubular structures in a concentric configuration.
Figure 10:
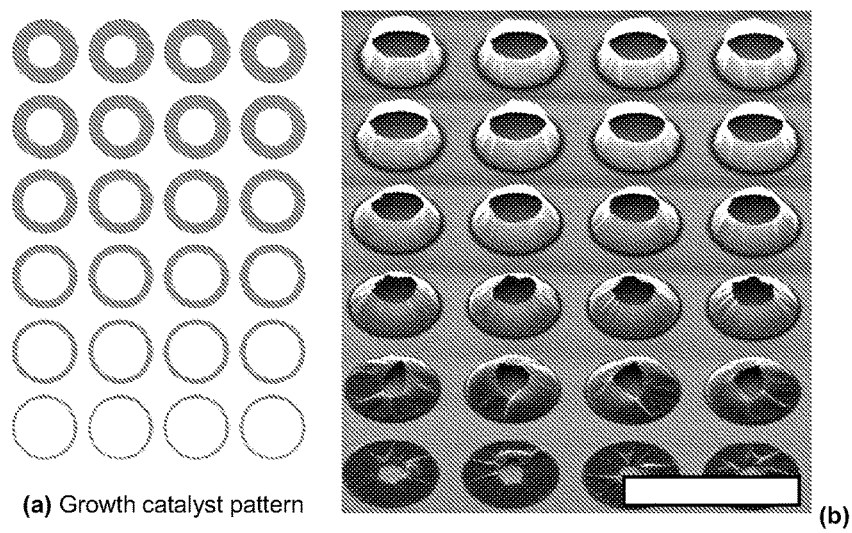
FIG. 10 illustrates an example of carbon nanotubes that were grown from catalyst patterns having varying wall thicknesses.
Figure 11:
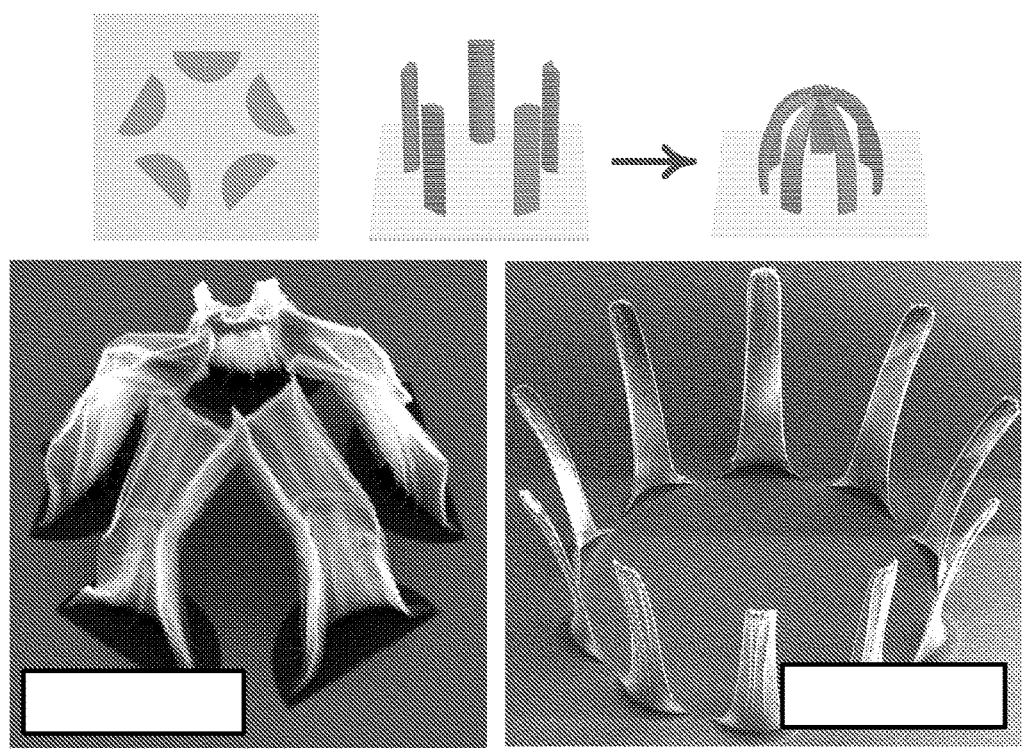
FIG. 11 depicts an embodiment of shaping a vertical carbon nanotube array having a semicircular cross-section.

Other more complex and versatile catalyst patterns and array shapes can be used with the shaping process to form more complex and tunable microstructures. For example, nanostructure arrays configured as hollow cylinders or tubes grown from a ring-shaped catalyst pattern can be shaped. Such a tubular array can be shaped into a micro-well or conical microstructure having a sloped sidewall as indicated in FIG. 9(a). The ratio of the cylinder wall thickness to its outer diameter controls the slope angle. This is shown best in FIG. 10, where CNT arrays were grown from the catalyst patterns of FIG. 10(a), with the outer diameter of the patterns being held constant and the wall thickness of the patterns being varied. FIG. 10(b) illustrates how decreasing the wall thickness, and thereby decreasing the ratio of wall thickness to outer diameter, can decrease the slope of the sidewall of the resulting microstructures. Starting with smaller diameter and taller hollow cylinders can yield microstructures such as those in FIGS. 9(b) and 9(c), where the slope of the microstructure sidewalls is generally higher. Another variation on the shaping of hollow cylinders is indicated in FIG. 9(d), where concentric tubular CNT arrays are shaped into concentric microstructures with overhanging walls having different slopes or radially-aligned sheets surrounding vertical needles. The available number, size, height, and wall-thickness combinations of these types of hollow cylindrical CNT arrays to be shaped into complex microstructures is virtually limitless.

In other examples, hollow and/or non-axisymmetric nanostructure arrays can be used to create sloped and curved forms by balancing the mechanical properties of the array with the capillary forces. One example is shaping a vertical CNT array having a semicircular cross-section as indicated in FIGS. 11(a)-(e). An array of this geometry can bend during the capillary forming process to give a curved beam or cantilever microstructure. Additionally, the arrays can be placed in close proximity to one another in pre-determined orientations on the substrate such that each array is shaped in its individually-determined direction. In this manner, complex microstructures comprising more than one individual microstructure can be constructed, such as those illustrated in FIGS. 11(c)-(e). It may be possible with certain array arrangements on the substrate to use immersion densification techniques to shape non-axisymmetric nanostructure arrays into microstructures such as those in FIGS. 11(a)-(e). For example, a single non-axisymmetric array on the substrate can be shaped using immersion densification as previously described. Also, where the spacing between adjacent arrays on the substrate is sufficient to reduce or eliminate liquid menisci formation between adjacent arrays, immersion densification can be used to shape nanostructure arrays into microstructures.

Figure 12:
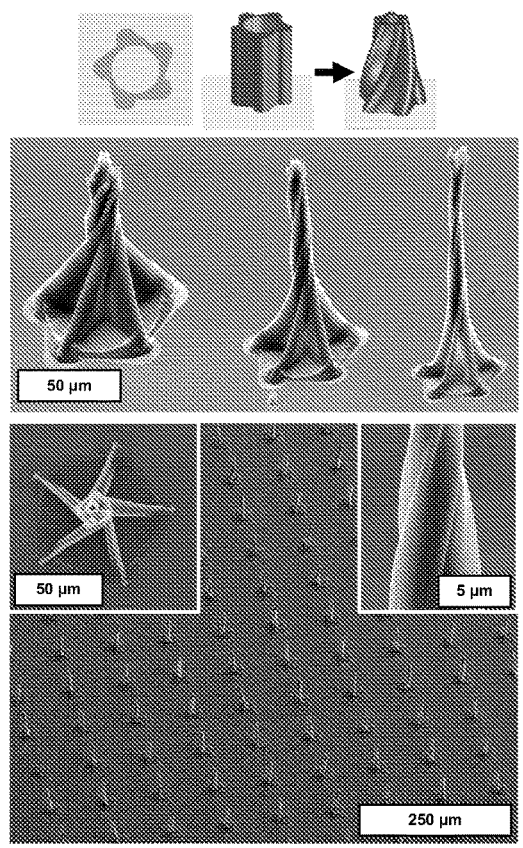
FIG. 12 illustrates an embodiment of structures having micro-helices that are formed from shapes comprising semi-circles merged with a thin annulus.

Combining the above elementary motions of contraction and bending, catalyst shapes can be designed that transform into more complex geometries. For example, FIG. 12 shows how intricate micro-helices with deterministic handedness are formed from shapes comprising semicircles merged with a thin annulus. The CNT forests fold inward and twist during capillary forming, and the helical angle and pitch are determined by the dimensions of the catalyst shape.

Figure 13:
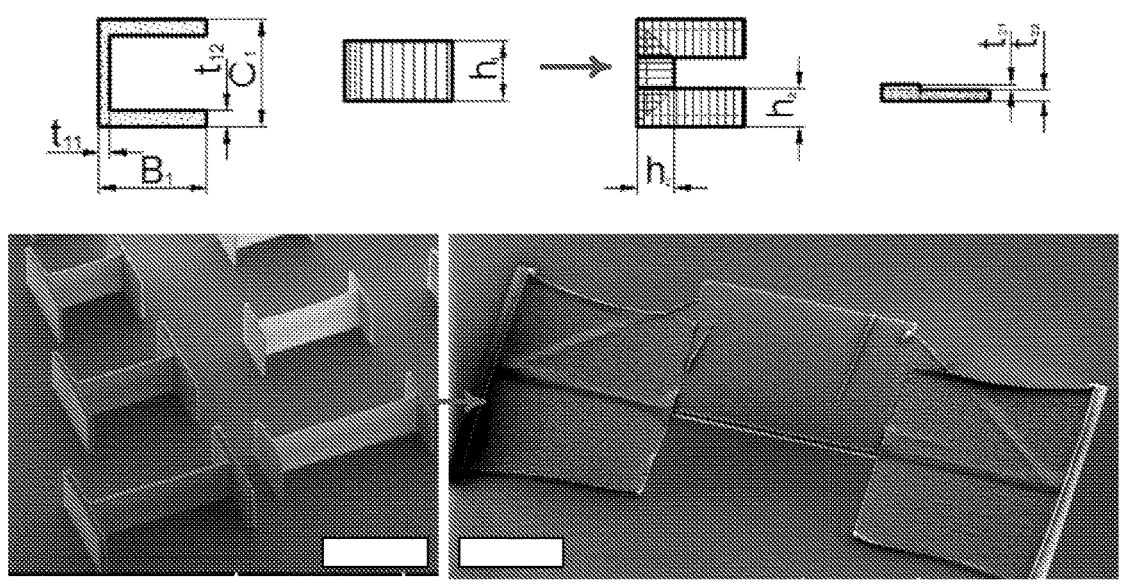
FIG. 13 depicts an exemplary geometry that permits folding of a nanostructure array during densification and shaping.

FIG. 13 depicts a geometry that permits folding of the nanostructure array during densification and shaping. The nanostructure array in this example generally has an orthogonal U-shaped cross-section with relatively thin wall-sections, wherein the bottom portion of the U-shape has a thinner wall-section than the side portions. During the shaping step, the thinner-wall bottom portion of the U-shape will collapse towards the substrate, and the sides of the U-shape will fold on top of the bottom portion. The SEM images of FIG. 13 depict a group of nanostructure arrays before shaping as well as one of the arrays as it exists after shaping using an evaporative wetting agent.

Figure 14:
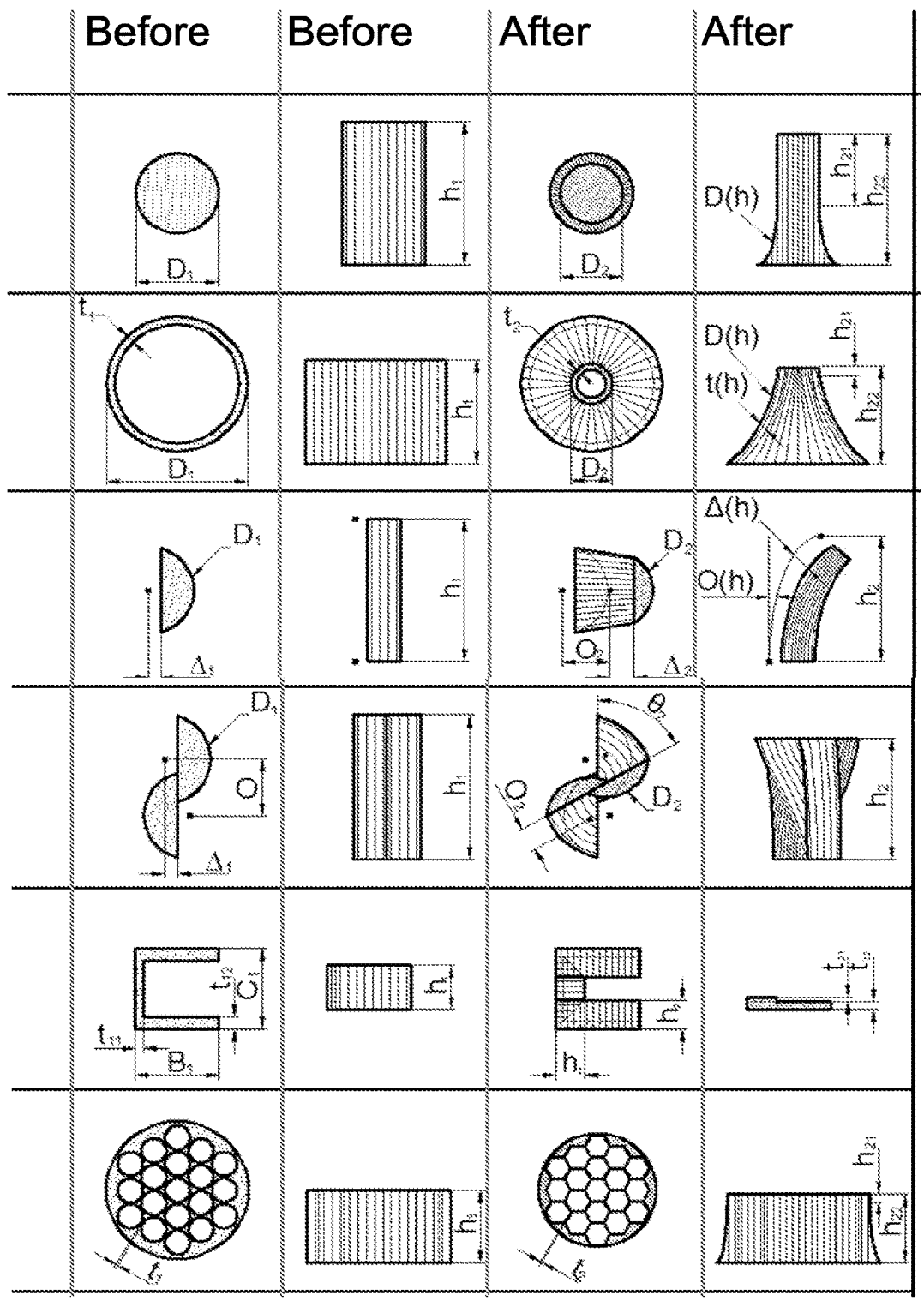
FIG. 14 illustrates a collection of various nanostructure array geometries along with their predicted microstructure geometries after shaping.

Referring to FIG. 14, a collection of various nanostructure array geometries are presented along with their predicted microstructure geometries after shaping. This includes, similar to FIG. 12, a geometry that will exhibit twisting behavior during the shaping step (see row 4 of FIG. 14, "Solid twisting"). This particular array geometry includes offset semi-circular cross-sections and is an example of one manner in which the design of the cross-sectional geometry of the nanostructure array can affect the distribution of the capillary forces and allow control of the direction of shaping. In general, these cross-sectional shapes may be any combination of closed curves, such as Boolean combinations of circles and semicircles.

Figure 15A:
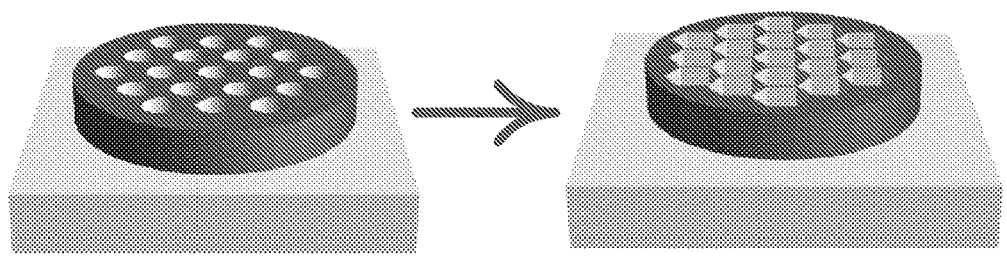
FIG. 15(a) illustrates an exemplary nanostructure array having a patterned array of voids.
Figure 15B:
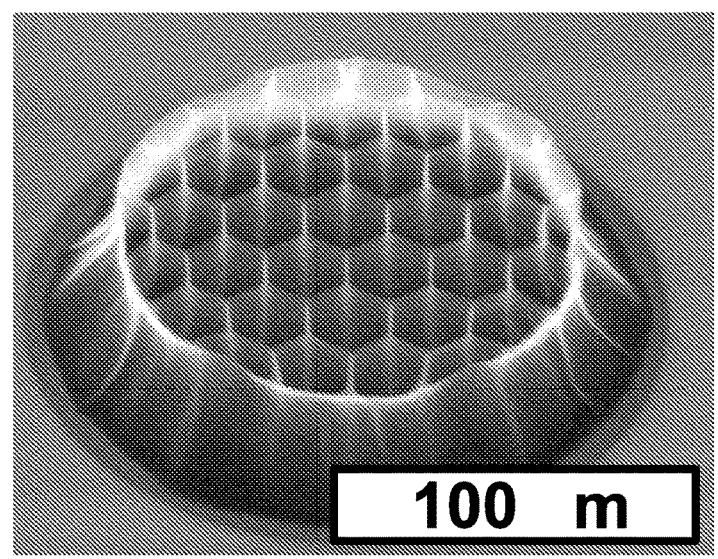
FIG. 15(b) illustrates another exemplary nanostructure array having a patterned array of voids.
Figure 15C:
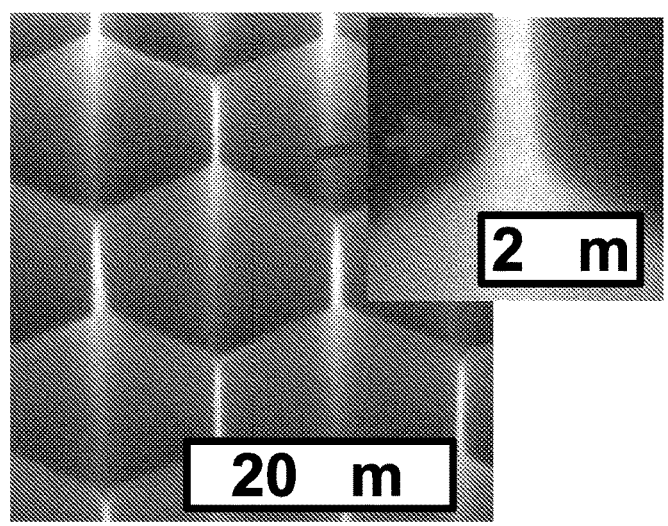
FIG. 15(c) illustrates a detailed portion of the exemplary nanostructure array of FIG. 15(b)

As discussed previously, starting with relatively short and wide arrays can create a random network of internal voids in the microstructure after shaping. But patterning an array of voids within the initial nanostructure array, can cause formation of a predictably ordered cellular network in the shaped microstructure. An example is illustrated in FIGS. 15(a)-(c). In the particular example shown in FIGS. 15(b)-(c), 5 μm spaces between initial circular holes within a larger CNT cylinder yielded a well-ordered hexagonal lattice microstructure with 0.7 μm wall thicknesses after shaping.

This demonstrates that the described shaping methods can achieve sub-micron feature dimensions, starting from inexpensive masks or other master templates with features in the micrometer range. In this manner, it may be possible to achieve feature widths (dimension generally perpendicular to the long axis of the nanostructures) as small as a few times the nanostructure width. In the case of CNTs, features having widths below 100 nm may be possible. In addition, experiments have shown that attainable aspect ratios meet or exceed those achieved by deep etching methods, and can be accomplished using a less complicated apparatus.

Figure 16:
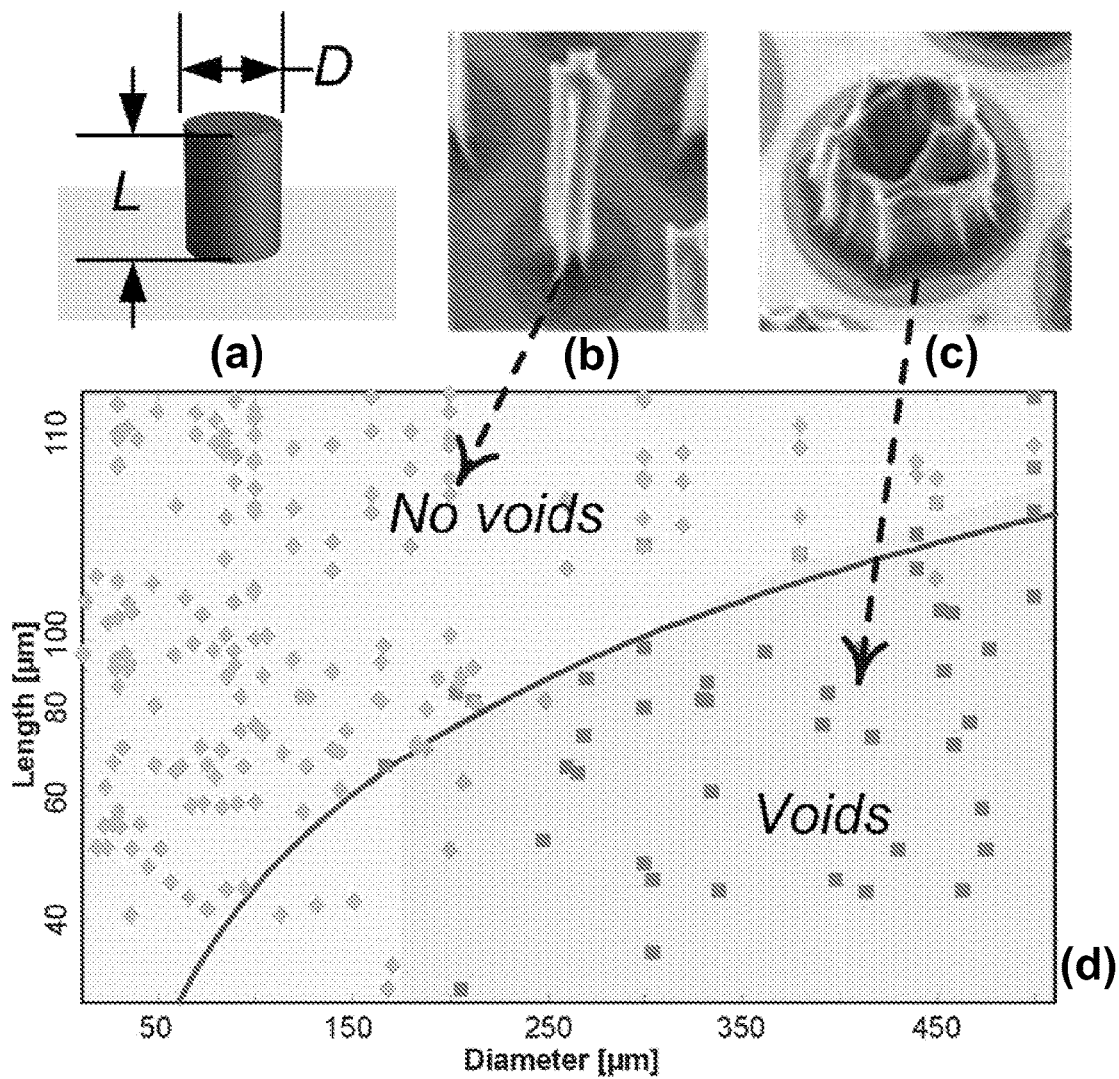
FIG. 16 includes FIGS. 16(a)-(d) which illustrate experimental data indicating whether width/height combinations result in final microstructures having solid cross-sections or including internal voids after densification.

Based on the aspect ratio (width/height) of the initial nanostructure arrays, the final microstructures can either have solid cross-sections, or can include internal voids due to the balance between the elastic deformation of the nanostructures and the capillary forces as the wetting agent travels through the arrays. FIG. 16, particularly FIG. 16(d), illustrates experimental data for the case of CNTs indicating whether various width/height combinations result in final microstructures having solid cross-sections or including internal voids after densification. Width/height combinations above the illustrated curve generally have solid cross-sections, and those combinations below the curves mostly have internal voids. Final microstructures having solid-cross-sections are preferable for predictability and mathematical modeling of the shaping process. But the shaping methods disclosed herein can be used with nanostructure arrays of any size and aspect ratio, and final microstructures having a foam-like structure, as in FIG. 16(c), with randomly distributed voids therein may be useful in some applications.

Control of Capillary Forming by CNT Growth Parameters

In addition to the cross-sectional geometry of the nanostructure array to be shaped by the methods herein described, other array attributes can affect the shaping process. For example the diameter, alignment, areal density, the adhesion of the CNTs at the base and top of the forest of the nanostructures within an array can affect the shaping process. More particularly, the stiffness and spacing of the nanostructures affects the balance of elastic and capillary forces as the wetting agent infiltrates and evaporates from the array. For example, CNT diameter affects the strength of van der Waals interactions between adjacent CNTs, and the alignment affects the maximum packing density of the final microstructures. The diameter and areal density of catalyst nanoparticles can be controlled by choosing the film thickness and annealing time (e.g., in $H_2$/He) before growth. By these methods, the densification factor (i.e., the ratio of the initial cross-sectional area of the CNT forest to the cross-sectional area at the midplane of the final structure after capillary forming) has been controlled in tests from approximately 5 to 30. The latter represents a bulk density of approximately 0.50 $g/cm^3$, and the theoretical maximum for tight packing of CNTs with these dimensions is 1.26 $g/cm^3$. These results were achieved using condensation of acetone, which was selected because of its attractive combination of a relatively high surface tension and high vapor pressure. Capillary forming using 2-propanol and glycerol can also be done as other examples, and in principle any liquid that wets the CNTs may be used. Further, confining the densification to a limited portion of the array or altering the nanostructure array properties by coating can affect the shaping process.

Additionally, it is possible to provide a gradient of nanostructure areal density within individual cross-sectional shapes to enable further control of the final 3D microstructure geometry. This can be accomplished by spatially varying the density of small voids within the growth catalyst pattern. These small voids can be designed to collapse upon capillary action, rather than form cells as happens with the larger voids that were described in FIGS. 15(a)-(c). It may also be possible to create nanostructure density gradients by depositing overlapping catalyst patterns or gradient films, or by spatially varying the reaction temperature using on-chip heating.

The spacing between individual arrays or microstructures on the growth substrate may also have an effect on the shaping process, as there may be a critical spacing below which condensed wetting agent will form a meniscus between adjacent nanostructure arrays and affect the ability of wetting agent that has infiltrated individual arrays to shape those arrays. This critical spacing when using evaporated wetting agent shaping methods is very small compared to the critical spacing when using liquid dipping densification techniques. In fact, the critical spacing for certain nanostructures when using liquid dipping densification techniques may be so large as to preclude the densification of multiple nanostructure arrays on a single substrate. By using the evaporated wetting agent shaping methods disclosed herein, nanostructure arrays can be spaced from one another on the growth substrate by 20 μm or less while maintaining the ability to independently and simultaneously shape each individual nanostructure array. This permits formation of microstructures from combinations of nanostructure arrays that are independently shaped into different relative orientations, for example, at compound angles relative to each other.

By using particular array geometries and combining certain attributes of each, tapering, bending, twisting, and folding of nanostructure arrays can be used to form complex microstructures in a predictable manner using the shaping methods herein disclosed. These methods particularly lend themselves to the batch manufacturing of freeform microstructures by offering the opportunity to collectively harness the attractive mechanical, electrical, thermal, and chemical properties of CNTs and/or other nanostructures in functional microstructures. Using these methods, microstructures can be fabricated with dimensions spanning those achieved by surface micromachining, bulk micromachining, and deep lithography of silicon and polymers. The growth substrate size is limited only by the size of the CVD chamber, such as a conventional tube furnace or heated substrate furnace. A diverse population of various 3D microstructures can be made simultaneously and in close proximity, which are characteristics that typical microstructure fabrication methods do not possess. In particular, it is possible to control the compound angle of the nanostructures by shaping as described herein, and to spatially vary this compound angle to create arrangements of shaped nanostructures having a plurality of compound angles in close proximity and on the same substrate. The resulting densified microstructures are robust to spin-coating and other conventional microfabrication processes. They can therefore be impregnated to create composite polymer/CNT, ceramic/CNT, and metal/CNT microstructures, or can be used as scaffolds for fabrication of freestanding structures of traditional materials, as will be further described herein.

Figure 17:
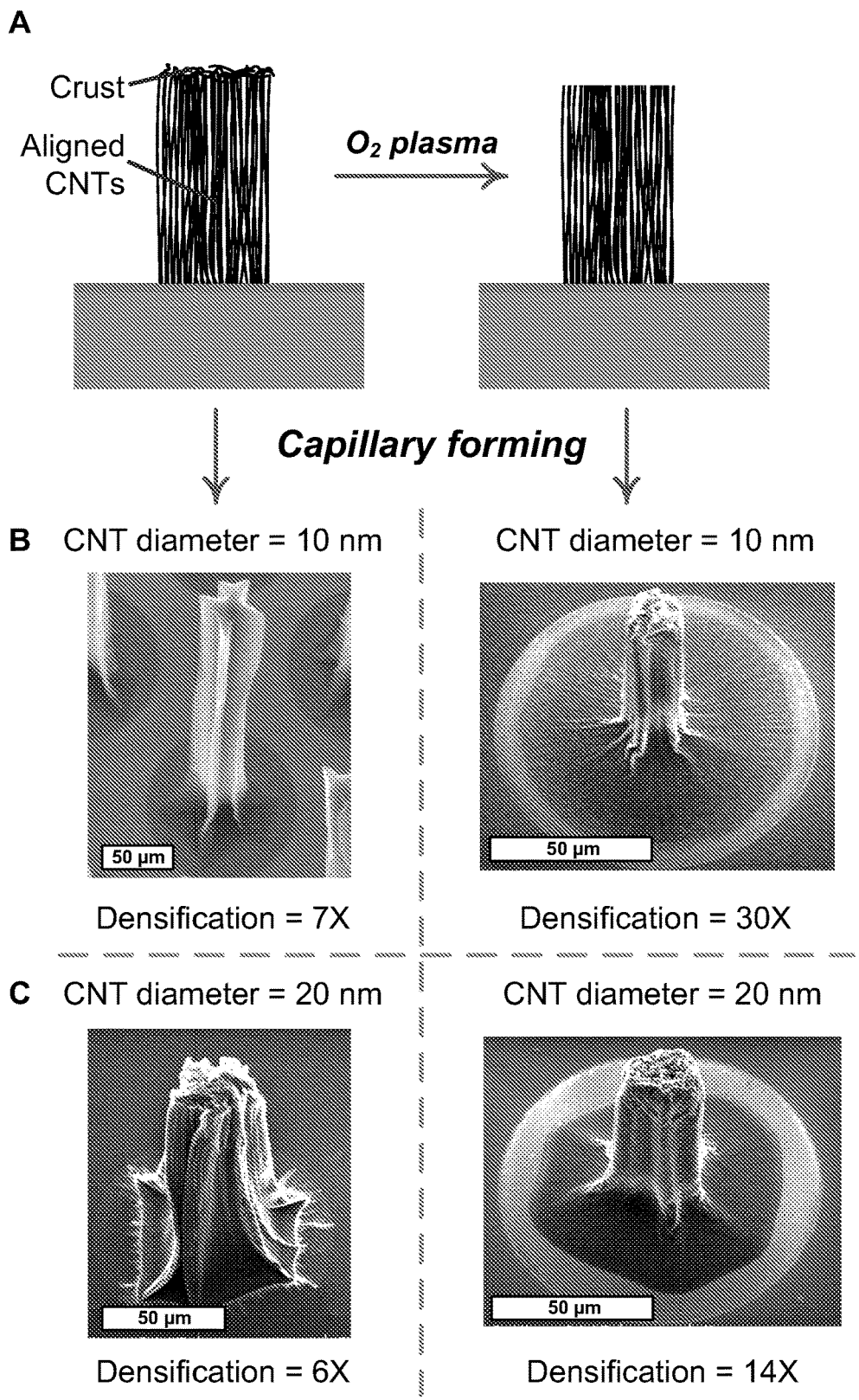
FIG. 17 illustrates an embodiment of controlling capillary forming by tuning growth conditions.
Figure 18:
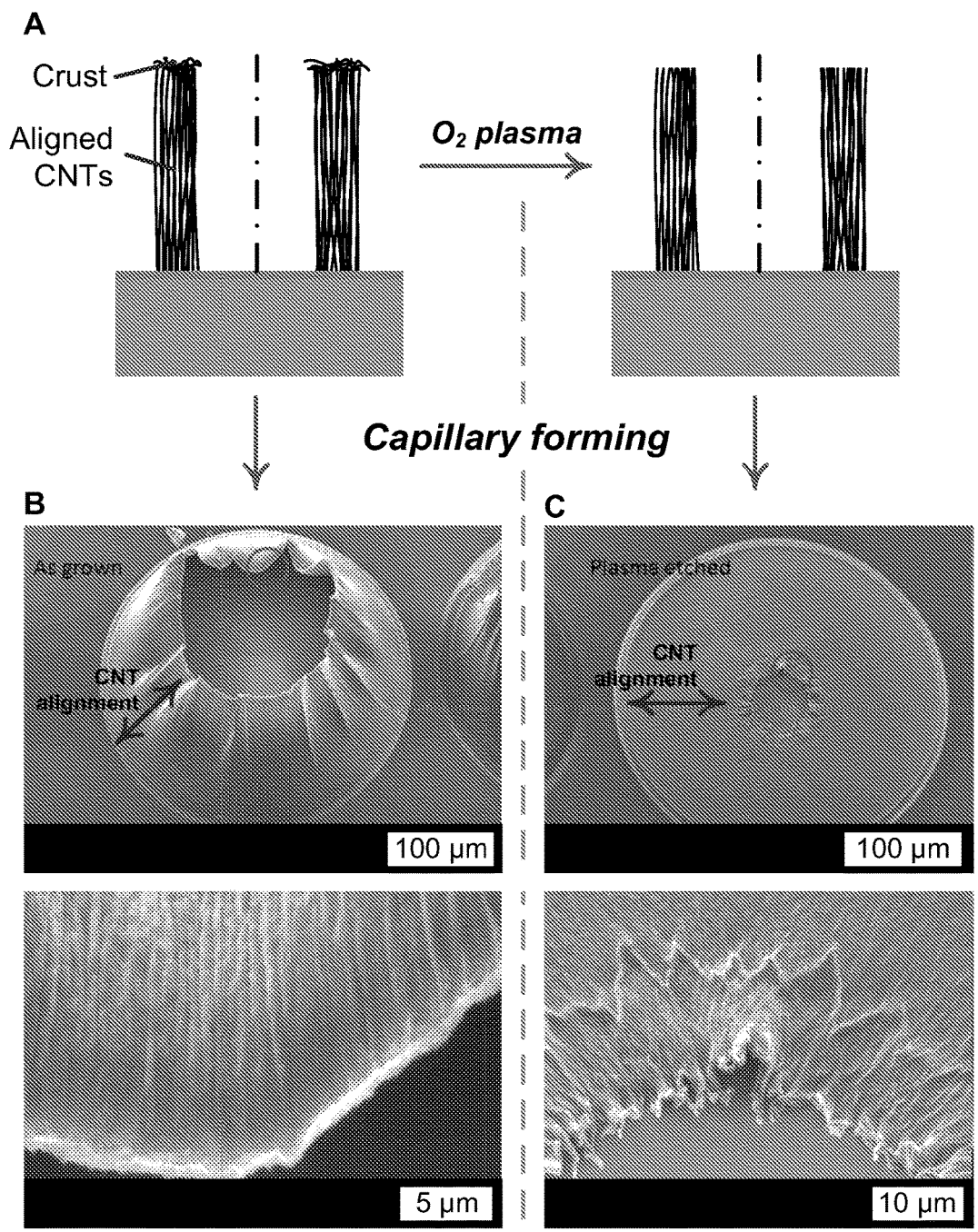
FIG. 18 illustrates another embodiment of controlling capillary forming by tuning growth conditions.

Additional control of capillary forming is achieved by tuning the CNT growth conditions. For instance, the CNT diameter, which is determined by the duration of catalyst annealing, influences the densification factor as shown in FIG. 17. Identical structures with larger diameter CNTs exhibit less densification under the same capillary forming conditions. During the initial self-organization stage of CNT forest growth, the tangled crust layer mentioned above is formed and resides on top of the CNT forests as show in FIG. 17A. This crust constrains lateral contraction of the CNTs. The crust also restricts slip among the CNTs during capillary forming, and thus increases the amount of lateral deflection due to the axial forces. Optionally removing this layer by brief $O_2$ plasma etching after growth enables more slip among the CNTs during the forming process, and thereby increases the densification factor, leads to more uniform radial contraction (FIG. 17C), and increases the relative influence of the lateral forces compared to the axial forces. On the other hand, the crust can prevent thin-walled structures from collapsing fully inward during capillary forming. For example, tall annular forests form hollow needles when the crust is retained, yet can form solid pins when the crust is removed because the inner wall collapses to the central axis of the annulus, see FIG. 9(c). The presence or absence of the crust also affects the stability of the tapered wells (FIG. 18), yet tunability of the wall angle based on the catalyst island dimensions is still achieved. The evolution of forces is also influenced by the adhesion of the CNTs to the substrate. If the CNTs detach from the substrate, the axial forces may relax, and typically weak adhesion of the CNTs to the substrate results in non-uniform detachment and poor control of the final shape. As a result, rapidly cooling the CNTs in the CVD growth atmosphere significantly strengthens the adhesion, and is useful for achieving consistent results.

Multiple Growth and Shaping Sequences

Figure 20A:
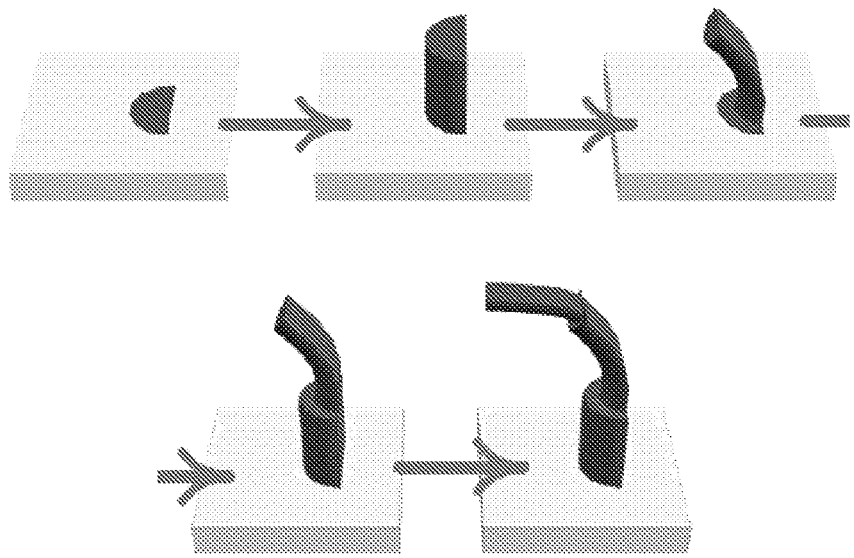
FIG. 20(a) illustrates an embodiment sequentially growing and shaping carbon nanotube arrays having semi-circular cross-sections.
Figure 20B:
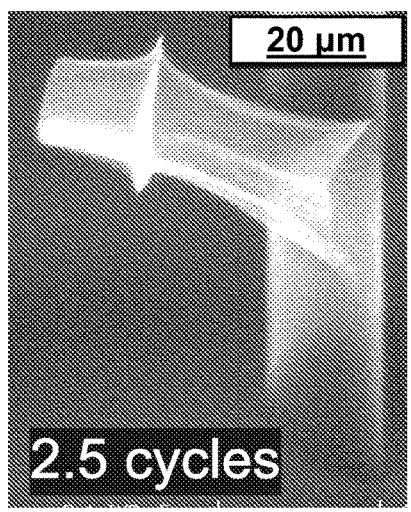
FIG. 20(b) illustrates an embodiment of a carbon nanotube having a semi-circular cross-section after 2.5 cycles of growing and shaping.
Figure 20C:
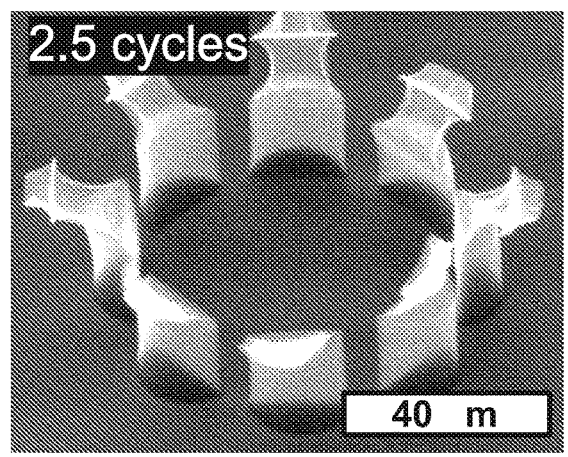
FIG. 20(c) illustrates an embodiment of carbon nanotube arrays having semi-circular cross-sections after 2.5 cycles of growing and shaping.

It is possible to recycle or reuse the growth catalysts used to grow nanostructures and nanostructure arrays or to assemble a sequence of different nanostructure layers by other means. For example, the Fe catalyst nanoparticles deposited on a substrate to grow CNT arrays can be used to initiate a second growth of CNTs after a first growth has been terminated. CNT arrays can be removed from the substrate after a growth cycle is terminated, or the second growth can be initiated without removing the arrays from the substrate. By combining the shaping methods described herein with multiple growth steps, complex 3D microstructures can be made. For example, by alternating growth and shaping steps on the same substrate without removing the nanostructures between steps, complex freeform microstructures such as those shown in FIG. 5 and FIGS. 19-22 can be made. For example, as indicated in FIG. 5, starting with a short, hollow cylinder array of CNTs, the first shaping step results in a tapered well microstructure. The second growth lifts this microstructure from the substrate. The second shaping step densifies the newly grown portion, without affecting the portion from the first growing and shaping steps. This alternating growing/shaping sequence can be repeated as desired. A tangled CNT layer typically can form at the interface between sequential growth regions and can result in a re-entrant "hourglass" shape to lower sections of these microstructures. Hence, a method of making a microstructure having a re-entrant geometry by shaping a plurality of aligned nanostructures is described. These features are reminiscent of "scallops" on the sidewalls of silicon structures etched by DRIE and undercuts caused by isotropic wet etching. However, in those traditional processes, it can be challenging to precisely control and spatially vary the radius of re-entrant curvature. FIGS. 19(a)-(c) illustrate sequential growing and shaping of hollow cylinder CNT arrays in various stages of microstructure formation. FIGS. 20(a)-(c) illustrate sequential growing and shaping of CNT arrays having semi-circular cross-sections. The resulting sequential curved beam microstructures can form a complex microstructure of aligned CNTs that can curve back toward the substrate to form an arch-like microstructure. This process can be used with any preferred type of nanostructures with any preferred method of stacking different layers.

In other examples, multi-step processing of thin-walled linear and circular patterns can result in orthogonal folding and formation of closed micro-containers such as those shown in FIGS. 21(a) and 22(a)-(b). In the examples shown, concentric ring patterns of growth catalyst are used to grow concentric hollow cylinder CNT arrays. The wall thickness of the outer cylinder is relatively thin to allow the outer array to collapse toward the center during shaping, forming a microstructure after the first shaping step that includes a tapered-wall hollow cylinder in the center surrounded by a ring of CNTs generally aligned horizontally and radially as shown in FIGS. 21(a) and 21(b). The second growth of CNTs creates new vertical cylinder walls, resulting in a microstructure having the geometry of a closed cylindrical container having a smaller diameter cylinder therein. Of course, variation of array wall thicknesses, diameters, number of concentric arrays, and number of growth and shaping cycles can result in numerous unique microstructures. These types of microstructure geometries cannot be constructed by known techniques, especially where the walls of the microstructures are comprised of CNTs or other nanostructures.

Another multi-step growth process can include a first growth of one type of nanostructure (e.g., CNTs), shaping of the first growth, then a second growth of another type of nanostructure (e.g., SiNWs), followed by shaping of the second growth. Moreover, the multi-step processes described above can be done by forming nanostructures either as growths of, for example, CNTs, or by other means, such as by etching to form SiNWs.

Analytical Modeling of the Shaping Process

The shaping of nanostructure arrays is governed by the distribution of lateral forces (locally perpendicular to the nanostructures) and axial forces (locally parallel to the nanostructures) within the array during capillary forming. These forces act throughout each structure due to the continuity of the CNTs and their adhesion to the substrate. Considering CNTs to be hollow cylindrical beams, the distance between the substrate and the point where two CNTs are pulled together during capillary forming can be described as $$L_I = \left(\frac{9}{2\cdot(\pi-2)}\right)^{1/4} \sqrt{d\cdot\sqrt{\frac{E\cdot\pi\cdot R^3}{4\cdot\gamma}}} \quad . \tag{Eq. 1}$$

Distance $L_I$ is depicted in FIG. 3(g). In Equation 1 above, d is the initial spacing of the CNTs in the array, E is the Young's modulus of an individual CNT, R is the CNT radius, and γ is the surface tension. In order to form a single aggregate without internal voids, a structure comprising N CNTs must have length exceeding $$L_S = L_I \cdot \left(\frac{\beta^2 \cdot (\pi-2)}{2\sqrt{\pi}\, 3^{1/4}(2-\sqrt{2})}\right)^{1/4} \cdot N^{3/8}, \tag{Eq. 2}$$

where β (=0.7) is a pre-factor accounting for the lattice geometry. Alternatively, if the CNT array is initially shorter than $L_S$, the final form has randomly distributed voids, as illustrated in FIG. 16(c). Critical length $L_S$ is also shown in FIG. 3(g). Some methods of immersion densification, as described previously, have been shown to create such "CNT foams" by immersing CNT forests in liquids. However, liquid immersion forms menisci that bridge across long distances, and therefore couples capillary forces among adjacent arrays. This enables hierarchical organization of relatively short nanostructure arrays, such as polymer nanopillars, but can aggregate and flatten thin-walled and delicate CNT structures, as previously indicated in FIG. 2(b). Alternatively, condensing the wetting agent onto the substrate or the array using the methods disclosed herein isolates wetting agent within each CNT array, and therefore allows each microstructure to be individually formed by the elastocapillary process.

The deformation of the primitive capillary formed structures can be predicted using a finite element model (COSMOL) comprising stiff vertical rods surrounded by a compliant matrix that contracts isotropically. While this is a highly simplified representation of the capillary forming process, it is possible to use existing computational tools to design capillary formed 3D structures based on knowledge of the diameter, spacing, and mechanical properties of the nanostructures.

Finite element or other models can allow specification of the size, starting position, and shape of each CNT, and thereby study how the CNT diameter and areal density, the shape of the catalyst pattern, and the shaping conditions can be engineered to precisely tune the final packing density of the CNTs and the final freeform microstructure shape. In comparing theory to experiment, the measured values of CNT diameter, areal density, and alignment can be inputs to the models, and the model outputs can be compared to measurements of the final microstructures. While each actual array includes over 100 CNTs/μm², it is not necessary to model the full population of CNTs. Instead, proportionality can be maintained between the model size and the actual CNT array dimensions. For example, an actual CNT array that is a 10 μm diameter×100 μm tall circular rod can be modeled as 1 μm diameter×10 μm tall as long as the number of CNTs in the model is sufficiently large to replicate the continuous shape of the structure and the moving interface. It may also be possible to model capillary interactions between adjacent CNT arrays on the same substrate. For example, if the arrays are close to one another and the vapor condensation rate is high, adjacent structures may be bridged by a meniscus, as necessarily occurs in solvent immersion methods of CNT densification. It may further be possible to adapt the models to consider multiple CNT layers (i.e., the multi-step growing/shaping microstructures) and possibly simultaneous growth and forming, where elongation of the CNTs is coupled to the moving liquid-vapor interface.

Figure 24:
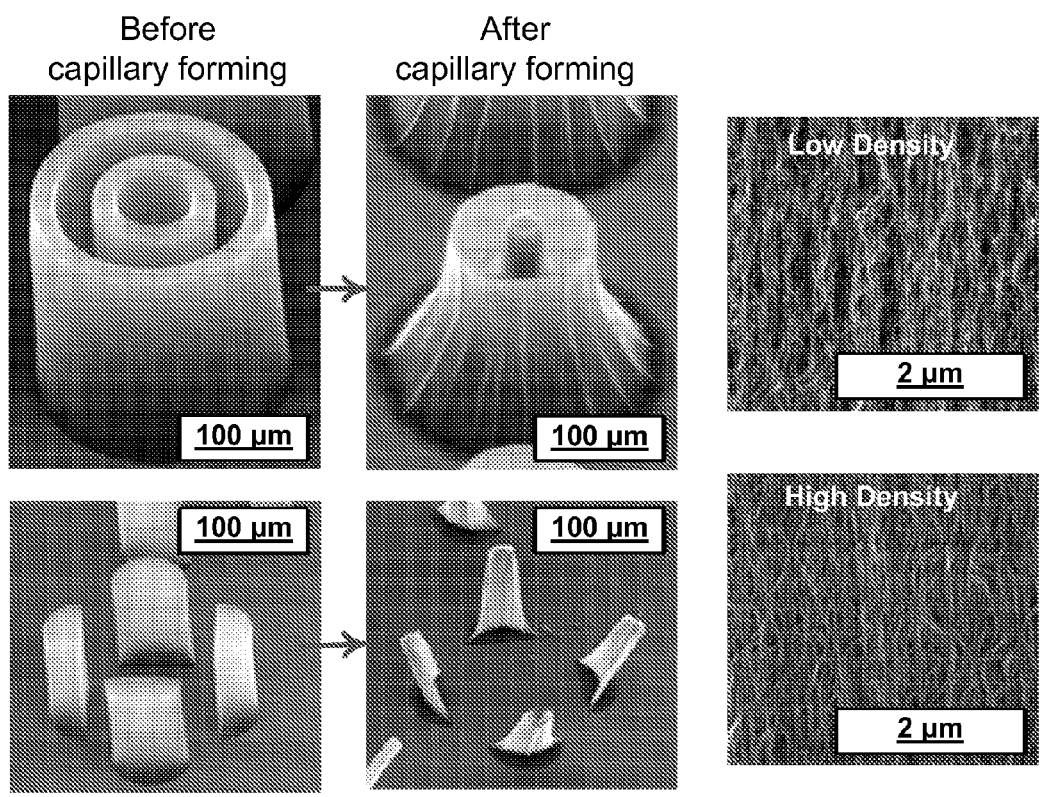
FIG. 24 depicts embodiments of carbon nanotube forests grown from hollow circular (axisymmetric) and solid semi-circular (bilaterally symmetric) catalyst shapes.
Figure 25:
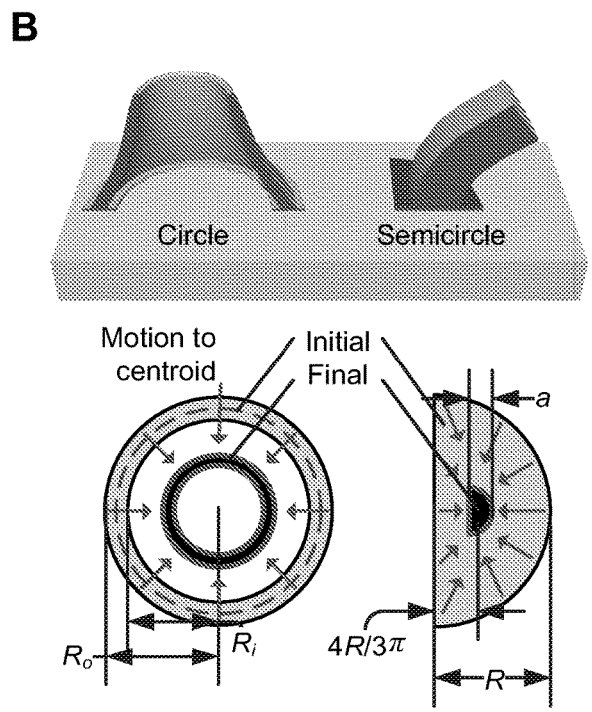
FIG. 25 is a diagram depicting contraction of carbon nanotube forests upon infiltration with a liquid.

The shaping of CNT forests grown from hollow circular (axisymmetric) and solid semicircular (bilaterally symmetric) catalyst shapes are shown in FIG. 24. Upon infiltration with liquid, surface tension causes the CNTs to aggregate locally according to the elastocapillary mechanism, and the forest globally contracts toward the centroid of its cross-sectional shape. Thus, for a circle, the contraction is toward the center; while for a semicircle, the contraction is toward the point at a distance 4R/3π from the straight edge of the semicircle, see FIG. 25. As this contraction occurs, the CNTs near the substrate are pulled inward toward the centroid; and because the CNTs are continuous through the forest, the contraction accordingly pulls down on the upper portions of the forest. For circles, the force distribution is axisymmetric and the final structure therefore slopes toward its apex. For semicircles, the force distribution is asymmetric. This causes the structure to deflect laterally along its axis of symmetry, creating a curved beam.

Figure 26:
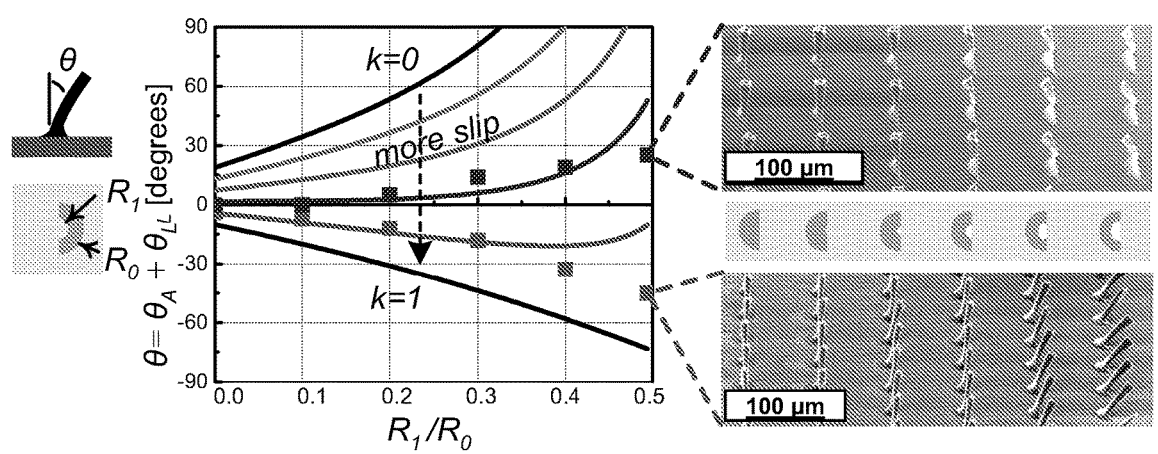
FIG. 26 illustrates an embodiment of shaping semi-annular carbon nanotube forests.

The shaping of semiannular CNT forests is shown in FIG. 26. The deflection angle θ can be precisely tuned by the choice of r, where $r=R_i/R_o$. This result shows that bending angle depends on the geometry of the pattern and the amount of slip, which can be controlled by the growth conditions and/or by etching the top surface of the CNT forests before capillary forming, as discussed herein.

Figure 27:
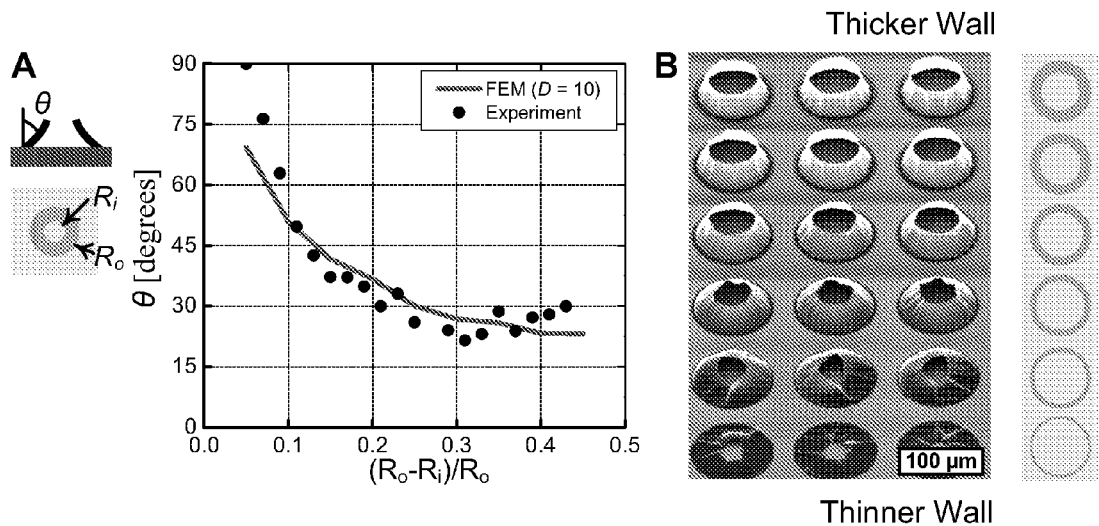
FIG. 27 illustrates an inverse relationship between wall thickness and deflection angle of relatively short forests grown from annular shapes.

In the case of annular CNT forests, the displacement of the CNTs toward the center depends on the wall thickness of annulus, which determines the elastic stiffness of the forest in response to the forces during capillary forming. Relatively short forests grown from annular shapes exhibit an inverse relationship between the wall thickness ($R_i$-$R_o$) and the deflection angle, as shown in FIG. 27. Thin-walled annuli fold inward and onto the substrate, creating circular thin films of radially oriented CNTs. The deflection angle of these structures can also be predicted accurately by a finite element (FEM) simulation shown in FIG. 27, which considers two-dimensional contraction of the initial CNT forest shape.

The final geometry can also depend on the CNT forest aspect ratio. For example, relatively tall structures grown from solid circles are formed into dense rods, whereas thick-walled annular forests form needles, and thin-walled annuli collapse to form sharp pins, see FIG. 9(c). Solid short cylinders can aggregate into short pins, or self-segregate into foams with randomly-distributed voids.

Practical Applications of Shaped Microstructures

Figure 28:
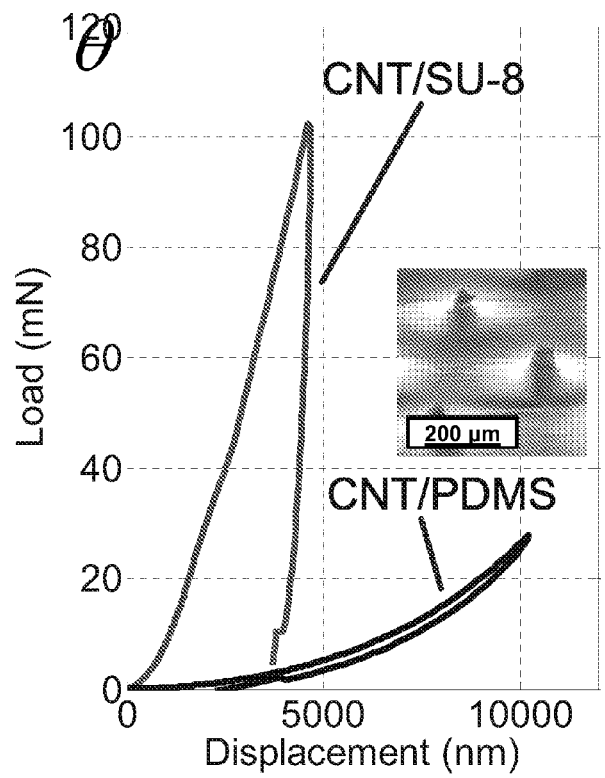
FIG. 28 is a graph depicting load and displacement of carbon nanotubes formed using SU-8 and PDMS.

Microstructures of the types made by the methods herein can be subjected to additional processes after the desired growing and shaping steps are complete. More particularly, these microstructures can be used as building blocks for composite microstructures. For example, solid or hollow circular nanostructure patterns can be shaped into dense needles and thin-walled tapered tubes using the evaporated wetting agent condensation methods. The resulting microstructures can then be infiltrated and/or spin-coated or dip-coated with a matrix material, by capillary infiltration, physical vapor deposition, by selective growth from the outer surfaces or any other method. Coating material choices are virtually limitless, including metals, polymers or other organic materials, ceramics, and other materials. More specifically, polymeric materials such as SU-8, PDMS, and PMMA can be deposited on the microstructures by spin-coating. In another example, amorphous Si or $Si_3N_4$ can be deposited on the microstructure by low-pressure CVD. In yet another example, $Al_2O_3$ can be deposited on the microstructure by atomic layer deposition (ALD). Uniformity, rate, and depth of infiltration into the spaces among the CNTs, as related to the CNT packing fraction, can vary depending of the infiltration/deposition method and the molecular weight and/or viscosity of the matrix, among other variables. In one such example of a composite microstructure, a simple densified circular cross-section CNT/SU-8 composite has been characterized has having a Young's modulus, in compression, in the tens of GPa, as shown in FIG. 28, where 50 μm diameter pillars were measured. A significant increase above pure SU-8 (usually about 5 GPa) is suggested.

The shaped 3D CNT nanostructures disclosed herein offer opportunities to exploit the multifunctional properties of CNTs in micro-scale devices, and to utilize the anisotropic arrangement of the CNTs to create new material behaviors. While the outstanding properties of individual CNTs are well-known, the low as-grown density (typically 1-5% of an ideal hexagonally packed configuration) of CNT forests gives mechanical, electrical, and thermal properties far beneath those of existing microfabrication materials. This fragility also typically renders as-grown CNT forests incompatible with lithographic processing. Instead, the capillary formed CNT structures have significantly enhanced bulk properties due to their high packing density.

Figure 29:
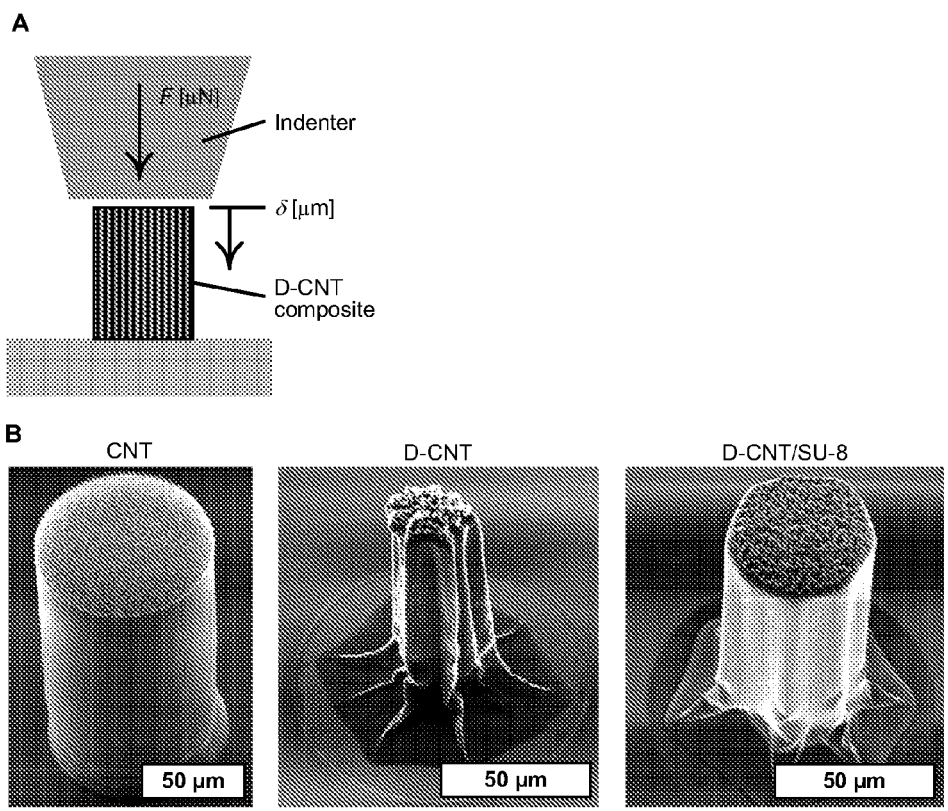
FIG. 29 illustrates an exemplary carbon nanotube reinforced conductive nanocomposite formed by spin-coating.
Figure 30:
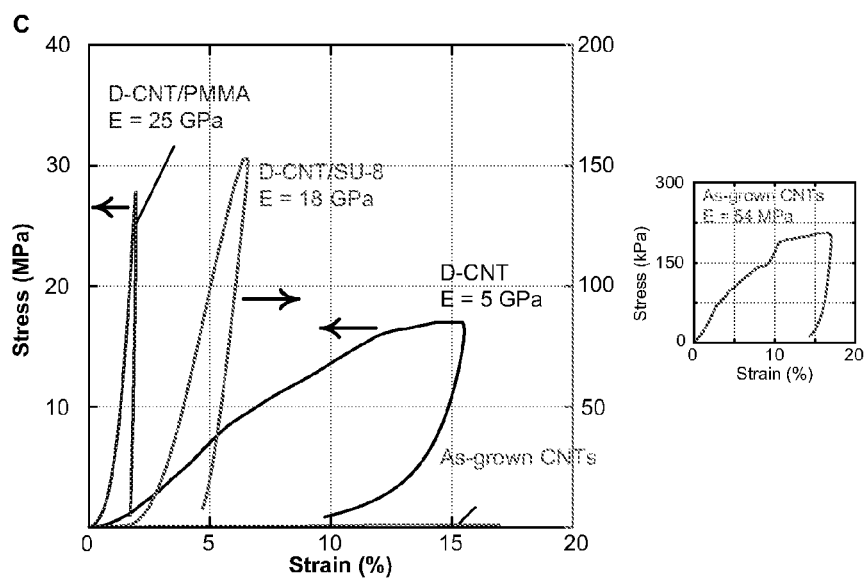
FIG. 30 is a graph depicting stress and strain of various copper nanotube structures.

As a result, the capillary formed shapes are not damaged by the strong inertial and viscous fluid forces from spin-coating processes. This permits coating of the shaped nanostructure array without altering its shape using a process that would otherwise alter the shape of the nanostructure array if applied prior to shaping by capillary-forming. For example, spin-coating can be used to cause self-directed infiltration of polymers into the individual structures that creates CNT-reinforced conductive nanocomposites (FIG. 29). As shown in FIG. 30, a dense CNT pillar (D-CNT) made by capillary forming has E=5 GPa, which is a ≈100-fold enhancement over the as-grown CNT structure (E=54 MPa). Typical composite structures have E=18 GPa for D-CNT/SU-8 and E=25 GPa for D-CNT/PMMA. These values are 5- to 10-fold enhancements over pure SU-8 (E=2-4 GPa) and pure PMMA (E=2-5 GPa), which are high values for aligned CNT nanocomposites. Also, the composite properties can be tuned by controlling the straightness of CNTs and the CNT-polymer interactions.

It is also possible to deposit reactive/activatable polymers on the surfaces of the freeform microstructures using CVD. This method can result in conformal coating of very thin layers on the re-entrant microstructures and CNT sidewalls, could later enable attachment of a wide variety of molecular constructs, such as fluorescent molecules and quantum dots, to their surfaces.

Figure 31:
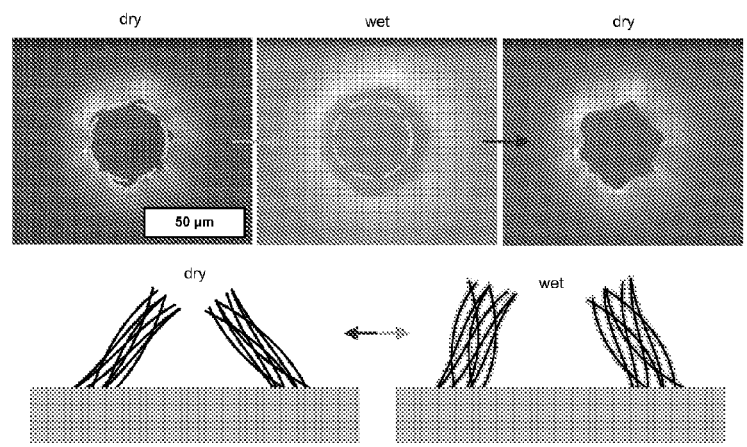
FIG. 31 illustrates an embodiment of active microstructures formed by spin-coating.

The ability to coat and/or infiltrate the nanostructure arrays with polymers also enables the creation of active microstructures. For instance, introducing a hydrogel (e.g., 2-hydroxyethylmethacrylate HEMA with cross-linker ethyleneglycoldimethacrylate EGDMA) by spin-coating into the D-CNT structures imparts a responsive behavior whereby the shape of the structure changes according to the ambient humidity. This is shown in FIG. 31 for a thin-walled annulus that was initially formed to θ≈45°. Real-time observation as the water vapor pressure is changed within an ESEM shows that the structure opens as the humidity increases, and closes again as the humidity decreases. Identical shape changes were observed over multiple cycles.

Because the CNT structures retain the hydrogel only within the 3D CNT template, their formation and response is determined by the local geometry and anisotropic mechanical properties of the CNT forest. Also, because swelling partially reverses the densification that occurred during capillary forming, other geometries such as helices and cantilevers could exhibit complex motions that are determined by the design of the nanostructure arrays. For example, these could possibly mimic the behavior of mechanosensitive hairs on insects and tree branches that change their shape in response to moisture and heat.

Figure 32:
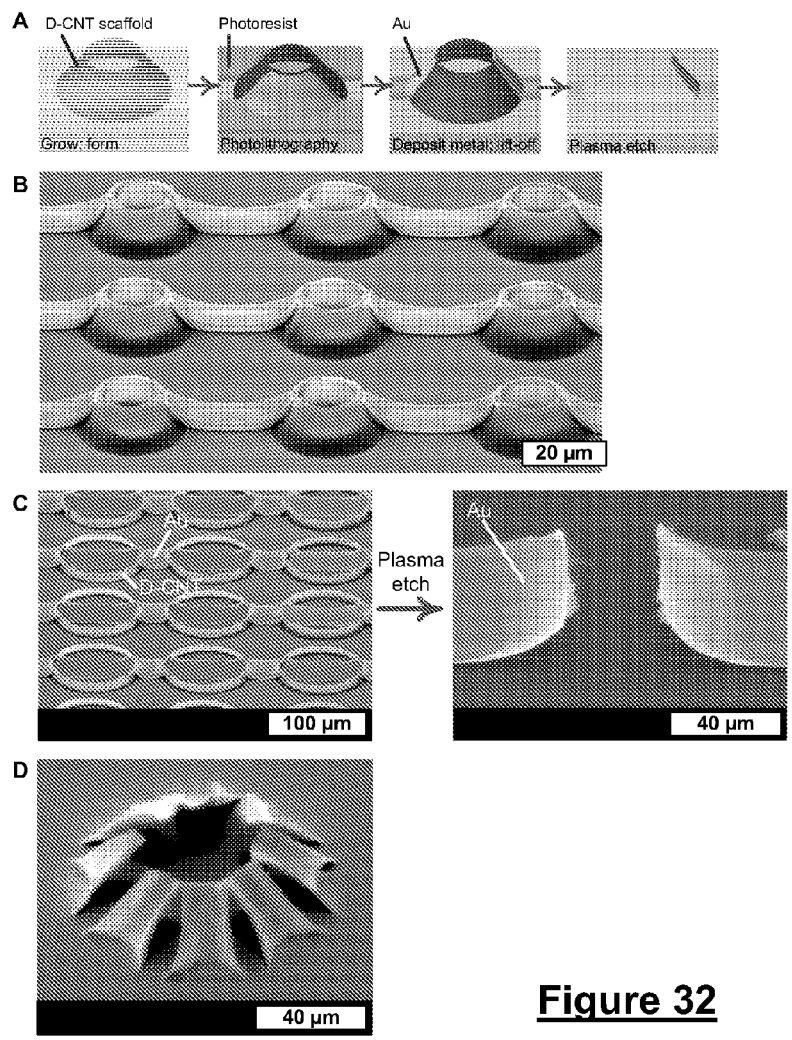
FIG. 32 illustrates an embodiment of forming freestanding metal films using microstructures as scaffolds.
Figure 33:
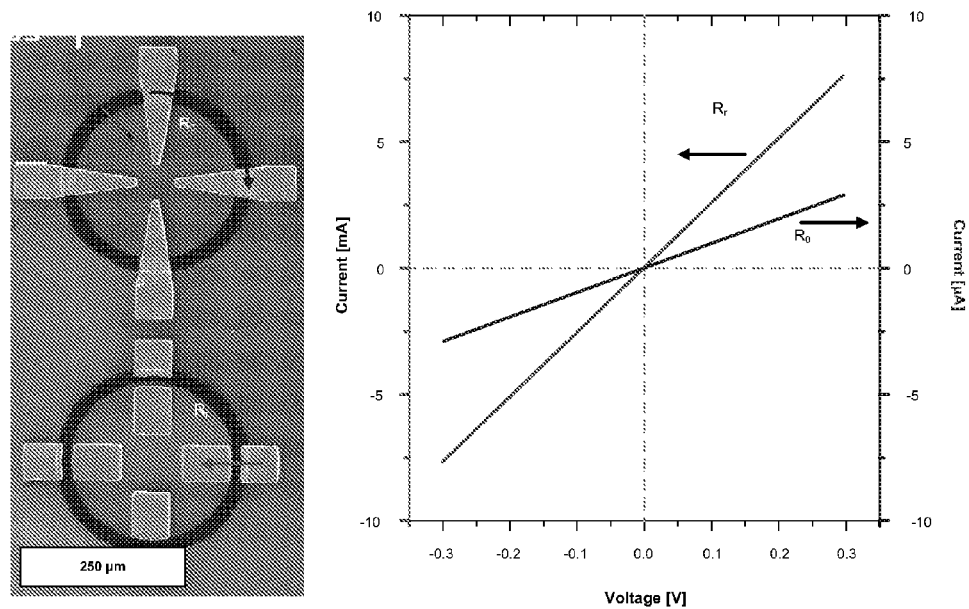
FIG. 33 illustrates electrical properties of metal thin films.

Additionally, freeform microstructures can be used as scaffolds for fabrication of free-standing microstructures made of other materials. For example, it has been found that even the smallest CNT microstructures that have been densified and shaped using these new methods can withstand many traditional microfabrication conditions, including spin-coating of polymers with a wide range of viscosities, baking, exposure, development, and metal deposition. Further, CNTs can operate in oxidative environments at up to 600° C. and survive well above 1500° C. in inert atmospheres. The mechanical robustness of the densified CNT structures also facilitates post-processing by conventional lithographic methods. Metal thin films can be patterned on non-planar surfaces such as the sidewalls of slanted micro-wells, and subsequent dry etching of the CNTs releases freestanding metal films (FIG. 32). Patterning of Au on radially oriented CNT films (≈400 nm thickness, FIG. 33) produced by capillary forming enabled characterization of their electrical properties. The films have resistivity 45 mΩ-cm in the radial direction ($R_r$) and 709 mΩ-cm in the circumferential direction ($R_θ$), which is a ratio of 16:1. This unique radial anisotropy of electrical conductivity would be preserved due to the CNT alignment in the sloped, folded, and twisted structures; and this can be useful for making 3D interconnects and micro-probes that take advantage of the mechanical strength and flexibility of CNTs.

Figure 34:
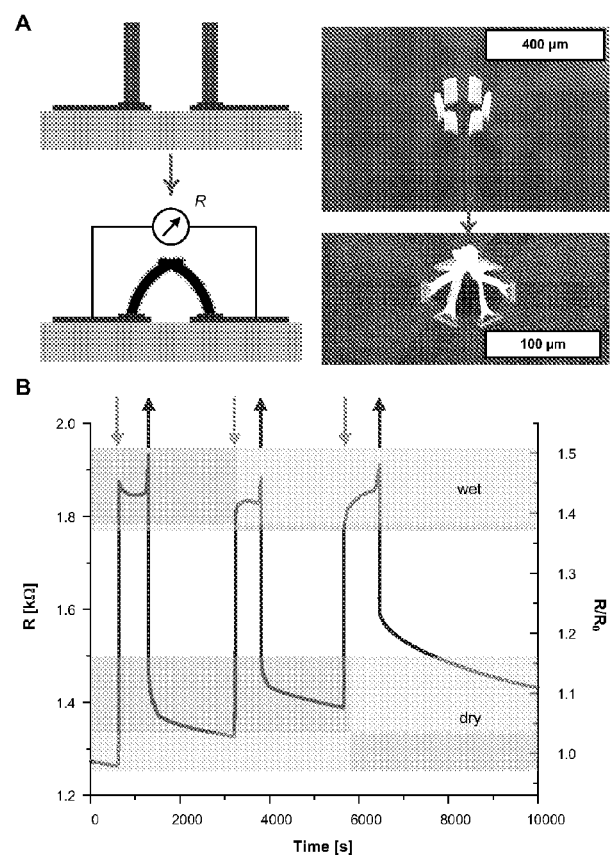
FIG. 34 illustrates an embodiment of an integrated sensor and actuator formed using carbon nanotubes.

Finally, the electrical anisotropy of the aligned CNTs and the responsive behavior of the 3D CNT/hydrogel composites are combined to create an integrated sensor and actuator, as shown in FIG. 34(a). A ring of CNT microstructures is grown from semicircles of catalyst deposited on patterned conductive TiN electrodes; and subsequent capillary forming causes the forests to bend inward to create a 3D bridge structure. The TiN contacts the base of the CNT pillars, and the capillary formed connection between the tips of the D-CNT structures closes the circuit. Repetitive flooding and drying of the D-CNT/hydrogel bridge with deionized water caused a rapid (<1 s rise time), significant (50%), and reversible change in the electrical resistance measured across the bridge as illustrated in FIG. 34(b). The resistance change occurs because the swelling increases the lateral space between the CNTs, and the abrupt jump in resistance when drying begins is because of the capillary force exerted on the bridge. Lateral CNT-CNT contact occurs at the apex of the bridge, and in this regard the anisotropy of the CNT network gives an inherently high sensitivity.

Figure 35:
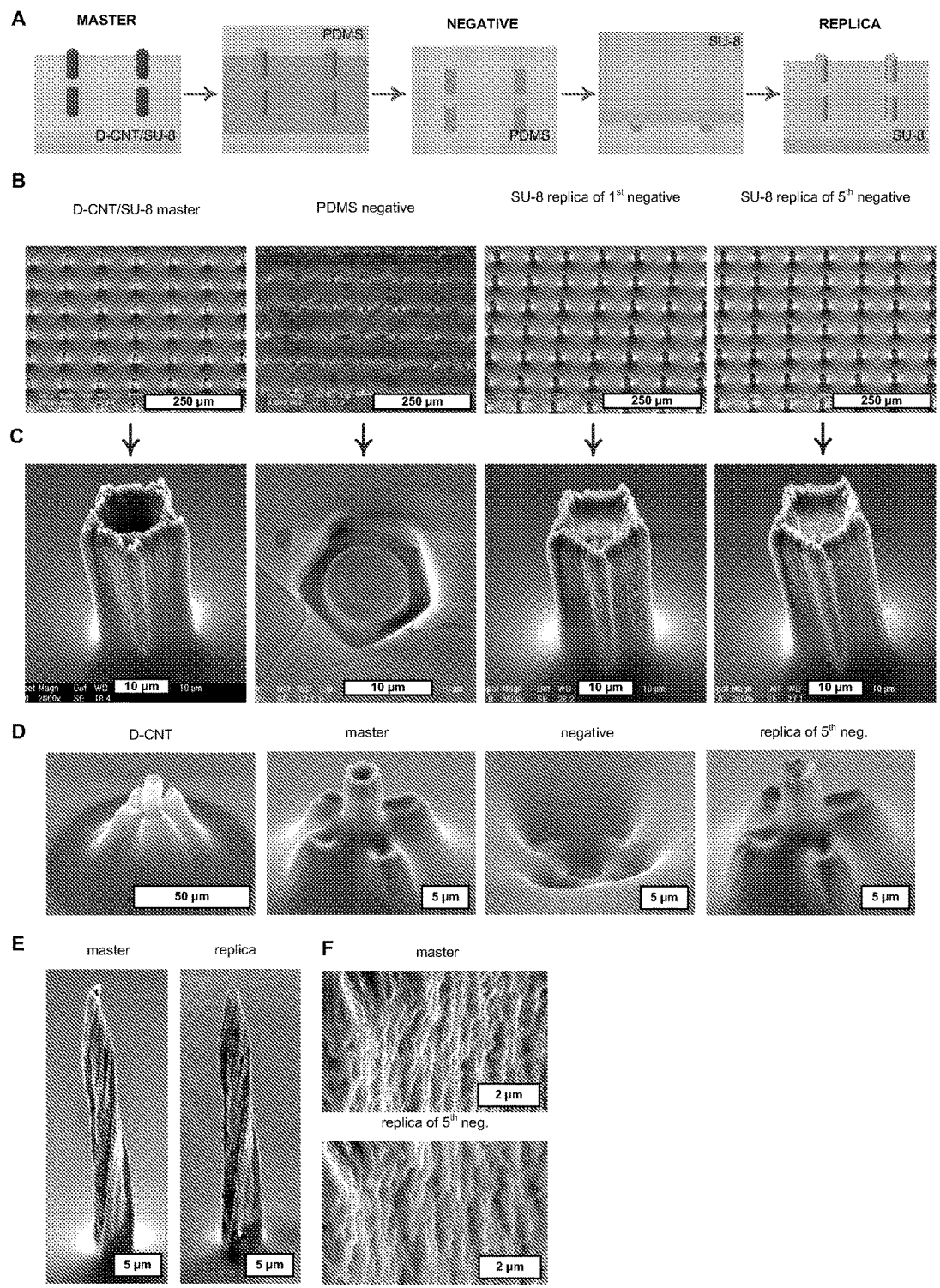
FIG. 35 depicts an embodiment of a process for replication of a microstructure array.

Owing to their mechanical robustness, the densified CNT structures can also be used as master molds for polymer replication. An example of this was done by replicating D-CNT/SU-8 composites in SU-8 using a PDMS negative mold, according to the diagram of FIG. 35(a) and example of FIG. 35(b). By this method, a variety of SU-8 structures were created including thin-walled tubes (FIG. 35(c)), folded "flowers" (FIG. 35(d)), and helical pins (FIG. 35(e)). The mechanical integrity of the CNTs gives repeated high-fidelity replication of both microscale form and sub-micron surface topography, over multiple cycles (FIG. 35(f)). This simple process also replicates some undercut structures such as slanted micro-wells. Arrays of polymer microstructures are used to study cell growth, differentiation, and mechanotransduction, and the ability to spatially vary the geometry and related properties of individual structures using capillary formed master molds represents an important new degree of design freedom. As will be appreciated from FIG. 35, the process for replication of replicating a microstructure array can include the steps of: (a) shaping a nanostructure array by densification of the array; (b) forming a negative mold by embedding the shaped nanostructure array in a mold material; (c) separating the mold from the shaped nanostructure array; (d) forming a replica of the shaped nanostructure array by filling the mold with a working material; and thereafter (e) separating the replica from the mold. Also, as shown, the process can be used for replicating a plurality of nanostructure arrays spaced from each other on single substrate. The working material can be any suitable material, such as a polymer, metal, ceramic, or sol-gel.

In one particular example of this replication process, after shaping the nanostructure arrays are spin-coated with SU8-2002 (3000 rpm, 60 s). SU-8 is pooled on the substrate prior to spinning. Then the SU-8 is cured by UV exposure using a Dymax 2000 EC Flood Lamp (75 mW/cm$^2$, 20 s). The SU-8 coating prevents infiltration of PDMS into the CNTs during the molding step, and increases the robustness of the structures as demonstrated by the mechanical tests. Then, a negative mold of the structure D-CNT/SU-8 master is obtained casting PDMS over the master, vacuum degassing, and curing for 9 minutes on a hot plate at 120° C. After curing, the PDMS negative is manually removed from the master.

Either the negative PDMS mold can be used as such, or this negative can be used to cast a replica of the original master structure. Replication is performed by casting SU-8 2002 onto the PDMS negative. The approximately 1 mm thick SU-8 cast is cured by baking on a hot plate at 120° C. for 14 h, followed by UV flood exposure (75 mW/cm$^2$, 20 s). The PDMS is manually removed from the replica. Note that the thickness of the SU-8 cast necessitates the long cure time; however, this could be reduced significantly.

Alternatively, starting from polymer, ceramic, or metal nanostructure arrays, for example metal or semiconducting nanowires, freeform microstructures can be made in a wide range of materials. Additionally, hybrid arrays comprising nanostructures fabricated from more than one material can be used to affect and/or enhance the properties of the resulting microstructure.

An application of freeform CNT microstructures is the control of surface wetting properties. In particular, asymmetric cantilever arrays can be useful to control the wetting properties of a surface. Intense research on understanding and controlling the interactions of liquids with surfaces has studied the combined effects of intrinsic chemical properties (determining the surface energy) and surface texture (ranging from nano- to microscale feature sizes) on wetting behavior. For example, the contact angle of a liquid on a surface can be manipulated by changing the size, spacing, and surface characteristics of micro-scale pillars. Microfabricated pillar arrays and nanofiber mats with features having re-entrant curvature have been shown to be omniphobic (contact angle >150° for both water and organic solvents), thereby mimicking the legendary behavior of the *Lotus* plant leaf. Engineering surface wetting behavior can be important for certain applications including on-chip biological assays and efficient heat transfer. However, surfaces are typically structured by etching and/or replication of silicon wafer templates that largely restrict geometries to vertical sidewalls or simple undercuts with isotropic orientation or by creating/depositing polymer or metal features having a random size distribution. Spatial variations in surface energy introduced by applying chemical, thermal, or electric field gradients can be used to direct liquid flow over a surface.

Figure 36:
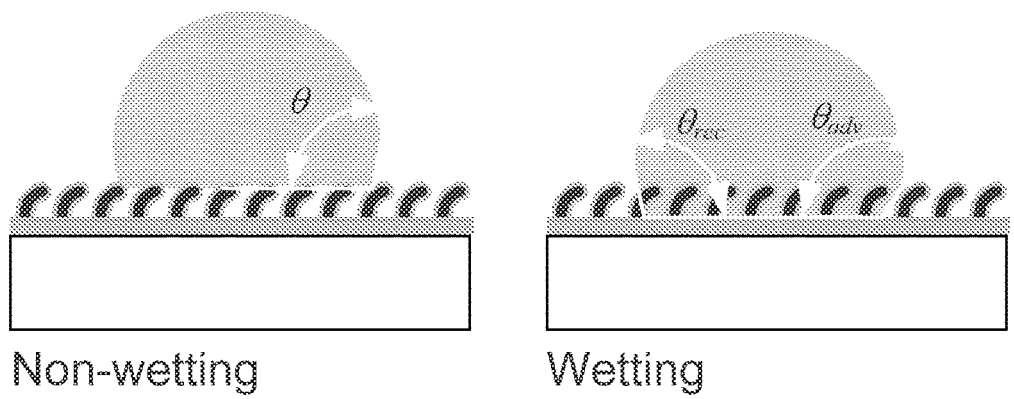
FIG. 36 is a diagram illustrating embodiments of asymmetric (bent) cantilever microstructures that can be fabricated using a shaping method disclosed herein.

Arrays of asymmetric (bent) CNT cantilever microstructures, such as those shown in FIG. 36, can be fabricated by the shaping methods disclosed herein. These cantilever microstructures can then be infiltrated and coated with polymers to prevent infiltration of liquid into the spaces among the CNTs. By selectively controlling the coatings, along with the cantilever microstructure geometry (width, height, tilt angle) and spacing, the static contact angle of various liquids having a variety of surface tensions can be controlled. Thus, the wetting properties of a surface can be tuned based on the surface geometry alone. The microstructure shaping methods disclosed herein can also facilitate experimentation with many surfaces having different geometries all fabricated on the same substrate, making the experimentation more efficient. In addition to the control of static contact angle, the dynamic spreading of droplets on the cantilever microstructure arrays can also be controlled. For example, applying ultrasonic vibration can "ratchet" the contact lines so a wetting droplet has net motion in the direction of greater contact area. Alternatively, electrically contacting the CNT microstructures can allow the use of electrowetting to move droplets. Practically, two intersecting "roadways" of cantilever microstructures tilted in opposite directions could be used to direct liquid mixing within microfluidic devices. Additionally, using a gradient pattern of cantilever microstructures with different shapes (i.e., width, tilt), may achieve passive fluid transport over short distances.

Figure 37:
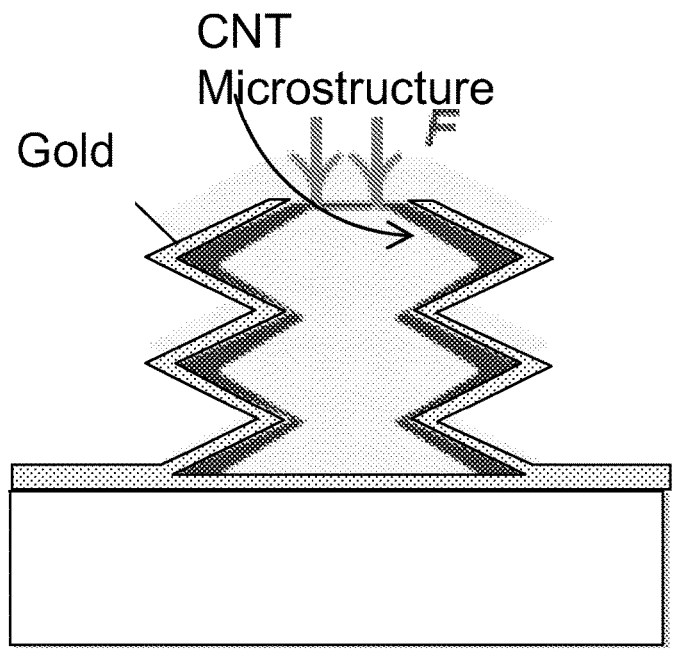
FIG. 37 depicts an embodiment of carbon nanotube composite micro-springs that can be fabricated by one or multiple growth/shaping operations using annular catalyst shapes.

Yet another application for CNT microstructures shaped by capillary forming is the construction of vertical micro-springs from CNT "bellows" microstructures as illustrated, for example, in FIG. 37. In traditional micro-spring arrays such as those used in probe card arrays for semiconductor testing, the need for vertical compliance has typically been met using cantilever springs. Simple monolithic vertical structures are too stiff, and uniform contact across a large array is difficult. Cantilever designs therefore compromise pitch for mechanical performance. Low contact resistance and long cycle life are also important requirements. Dense cantilever arrays are made by serial methods such as wire bonding, and a parallel process could significantly reduce manufacturing cost. The bellows microstructure can have tunable stiffness and large travel, within a compact vertical design. The bent cantilever microstructures previously described can also be used as probe structures or as 3D interconnect vias.

CNT composite micro-springs (FIG. 37) can be fabricated by one or multiple growth/shaping operations using annular catalyst shapes such as those shown in FIG. 19. One "fold" is created per two sequences. Therefore under identical growth and densification conditions, the structural stiffness may be governed by the catalyst dimensions, the growth time per cycle, and the number of folds. After fabrication of the CNT bellows microstructure, Au can be deposited by e-beam evaporation with the microstructure on a rotating stage. Uniform metal coating of all surfaces by electrodeposition can be performed, if necessary. Although CNTs are electrically conductive, metal coatings such as Au can provide even lower electrical resistance. Thus, the CNT microstructure is primarily utilized as a mechanically resilient supporting structure. Using a nanoindentation machine equipped with a conductive tip, the force-displacement and resistance-displacement behavior of springs with different structural parameters can be characterized and benchmarked to industry-standard probe cards (e.g., 50 µm pitch, 10 g/mm stiffness).

Other applications include but are not limited to: RF oscillators, transparent and non-transparent conductive polymer, scaffolds and templates for the organization of cells and tissues, controlled compartments for chemical or biochemical reactions, photonic crystals and any other microsystem requiring 3D shapes, small features or the specific material properties of CNTs or other nanostructures such as high electrical and thermal conductivity.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example", "for instance", "such as", and "like", and the verbs "comprising", "having", "including", and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A method of making a nanostructured assembly, comprising the steps of:
   providing a nanostructure array comprising a plurality of nanostructures attached to a substrate; and
   shaping the nanostructure array by condensing an evaporated wetting agent on at least one of the substrate or the nanostructures and evaporating the condensed wetting agent.

2. The method of claim 1, wherein the shaping step comprises densifying at least a portion of the nanostructure array.

3. The method of claim 1, wherein the providing step includes a first step of forming nanostructures, and wherein the method further comprises, after the shaping step, a second step of forming nanostructures and thereafter shaping the nanostructures formed during the second step.

4. A method of making a nanostructured assembly, comprising the steps of:
   providing a nanostructure array comprising a plurality of nanostructures attached to a substrate, including a first step of forming nanostructures;
   shaping the nanostructure array by condensing an evaporated wetting agent on at least one of the substrate or the nanostructures; and
   after the shaping step, performing a second step of forming nanostructures and thereafter shaping the nanostructures formed during the second step, wherein the nanostructures formed during the second step are located between a growth substrate and the nanostructures formed during the first step.

5. The method of claim 1, further comprising the step of fabricating a plurality of nanostructure arrays on a substrate such that at least some of the nanostructure arrays are arranged so that together they form a desired configuration, and wherein the shaping step further comprises forming the desired configuration by shaping at least some of the plurality of arrays.

6. The method of claim 5, wherein the shaping step further comprises forming the desired configuration by orienting one or more of the nanostructure arrays at a compound angle relative to at least one of the other nanostructure arrays.

7. The method of claim 1, wherein the shaping step comprises:
   providing an evaporated wetting agent source, and
   supporting the substrate above the evaporated wetting agent source such that the nanostructures extend towards the evaporated wetting agent source.

8. The method of claim 1, wherein the shaping step further comprises causing the nanostructure array to twist or bend.

9. The method of claim 1, wherein the nanostructures comprise carbon nanotubes or silicon nanowires.

* * * * *